United States Patent
Iwanari et al.

(10) Patent No.: US 7,991,945 B2
(45) Date of Patent: Aug. 2, 2011

(54) SEMICONDUCTOR MEMORY DEVICE AND SEMICONDUCTOR DEVICE

(75) Inventors: Shunichi Iwanari, Kyoto (JP); Hisakazu Kotani, Kyoto (JP); Masanori Matsuura, Kyoto (JP)

(73) Assignee: Panasonic Corporation, Osaka (JP)

( * ) Notice: Subject to any disclaimer, the term of this patent is extended or adjusted under 35 U.S.C. 154(b) by 568 days.

(21) Appl. No.: 12/136,340

(22) Filed: Jun. 10, 2008

(65) Prior Publication Data

US 2008/0313391 A1 Dec. 18, 2008

(30) Foreign Application Priority Data

Jun. 12, 2007 (JP) ................... 2007-155007

(51) Int. Cl.
*G06F 13/00* (2006.01)
*G06F 13/28* (2006.01)
*G11C 7/00* (2006.01)

(52) U.S. Cl. ............... 711/103; 711/167; 711/E12.002; 365/189.011

(58) Field of Classification Search .............. 711/103, 711/167, E12.002; 365/189.011
See application file for complete search history.

(56) References Cited

U.S. PATENT DOCUMENTS

| 6,977,845 | B2 | 12/2005 | Kawai et al. |
| 7,164,605 | B2 | 1/2007 | Kawai et al. |
| 2005/0018486 | A1 | 1/2005 | Kawai et al. |
| 2006/0092708 | A1 | 5/2006 | Kawai et al. |
| 2010/0226176 | A1* | 9/2010 | Li ............... 365/185.03 |

FOREIGN PATENT DOCUMENTS

JP 2005-025819 1/2005

OTHER PUBLICATIONS

"Toshiba TH58NVG1S3AFT05: Tentative Toshiba MOS Digital Integrated Circuit Silicon Gate CMOS," p. 1-32, May 19, 2003.

* cited by examiner

*Primary Examiner* — Edward Dudek, Jr.
(74) *Attorney, Agent, or Firm* — McDermott Will & Emery LLP

(57) ABSTRACT

A semiconductor memory device, including: a cell array block including a plurality of memory cells arranged therein; and a controller, wherein the controller controls the semiconductor memory device so that: an operation of reading out data from a second region in the cell array block is initiated before completion of an operation of outputting data read out from a first region in the cell array block; and the data read out from the second region is output successively after the completion of the operation of outputting data read out from the first region.

13 Claims, 19 Drawing Sheets

SEMICONDUCTOR MEMORY DEVICE AND SEMICONDUCTOR DEVICE

BACKGROUND OF THE INVENTION

1. Field of the Invention

The present invention relates to a semiconductor memory device, and a semiconductor device using the same.

2. Description of the Background Art

Many of EEPROMs (Electrically Erasable Programmable ROMs) currently known in the art employ memory cells of the type where a charge is stored at the floating gate. One of such memory devices, NAND-type flash memory devices, employ a cell array including NAND cell units each having a plurality of memory cells connected together in series. In a NAND cell unit, adjacent memory cells share source/drain diffusion layers. Therefore, by increasing the number of memory cells provided in a NAND cell unit, it is possible to increase the capacity of the NAND-type flash memory with a relatively small chip area.

In a NAND-type flash memory, a plurality of memory cells are connected together in series, as described above, and to a bit line. Data is read out from the NAND-type flash memory by detecting the presence/absence or magnitude of the discharge of the bit line by a selected cell in a NAND cell unit. A pass voltage, which turns ON the cell irrespective of the data therein, is applied to non-selected cells in the NAND cell unit. Since a plurality of cells are connected together in series, a NAND cell unit has a high channel resistance, and the readout cell current is small.

Therefore, it takes a long time before a predetermined voltage difference occurs along the bit line depending on the cell data, and the data read operation of a NAND-type flash memory takes about 20 to 25 μs. During the operation, the NAND-type flash memory externally outputs a busy signal indicating that a read operation is being performed, thereby limiting external accesses to the memory chip of the NAND-type flash memory.

FIG. 16 is a block diagram showing a general configuration of a conventional NAND-type flash memory.

Referring to FIG. 16, a cell array 1 includes a plurality of floating gate-type memory cells arranged in a matrix pattern. A row decoder (including the word line driver) 2 is responsible for selecting a block of the cell array 1, selectively driving a word line, and selectively driving a selected gate line. A sense amplifier circuit 3 forms a page buffer circuit including a page's worth of sense amplifiers for sensing the bit line data of the cell array 1.

A page of readout data is selected by a column decoder (column gate) 4 and is output to an I/O line 13 via an I/O buffer circuit 5. Write data supplied from the I/O line 13 is transferred to the sense amplifier circuit 3 as selected by the column decoder 4. An address signal is input to an address holding circuit 6 via the I/O buffer circuit 5, and a row address and a column address are transferred to the row decoder 2 and the column decoder 4, respectively, via an address predecoder 8.

A controller 9 outputs internal timing signals for the read operation, the write operation and the erase operation based on control signals such as a write enable signal XWE, a read enable signal XRE, an address latch enable signal ALE and a command latch enable signal CLE. Based on the internal timing signals, the sequence operation of the data read operation, the data write operation and the data erase operation is controlled.

A high voltage circuit 10, being controlled by the controller 9, produces a different voltage depending on the operation being performed, i.e., the read operation, the write operation or the erase operation. A busy signal generation circuit 11 outputs a busy signal RY/XBY for indicating, to the outside of the chip, the access status of the cell array 1, depending on the operation being performed, i.e., the read operation, the write operation or the erase operation.

FIG. 17 is a timing chart showing the data read operation of a conventional NAND-type flash memory, and FIG. 18 is a timing chart showing the data write operation thereof.

In the read operation, as the write enable signal XWE and the address latch enable signal ALE="H" are input to the controller 9 from outside the chip and the address signal Add is input to the I/O buffer circuit 5 from the I/O line 13, the data read operation from the cell array 1 is started. Typically, a NAND-type flash memory performs a data read operation page by page. When the cell data read operation is started, the busy signal RY/XBY="L" is output from the busy signal generation circuit 11 to outside the chip.

After the cell data read operation for a predetermined amount of time, a page of data read out to the sense amplifier circuit 3 is output to the I/O line 13 via the I/O buffer circuit 5 based on the read enable signal XRE. The operation thus far is one cycle of the read operation. Specifically, one cycle of the read operation includes an operation of reading out the cell data from the cell array 1 to the sense amplifier circuit 3 (hereinafter referred to as the "cell data read operation"), and an operation of outputting the readout data from the sense amplifier circuit 3 to outside the chip (hereinafter referred to as the "readout data outputting operation"). A read cycle as described above is repeated when continuously reading out pages of data.

In a read operation, different cell data cannot be read out during the true busy period where the busy signal RY/XBY="L". If the capacity is further increased in the future by increasing the number of memory cells provided in a NAND cell unit, the cell current will be even smaller, thus requiring a longer time for reading out cell data.

In a write operation, the address latch operation (Add.1 IN), the data latch operation (DATA.1 IN) and the data programming operation (PROGRAM 1) are all performed in series in a first write cycle, and then a second write cycle is similarly performed on a different address. As with the read operation, if the number of memory cells in a NAND cell unit increases, it will require a longer time for writing data to memory cells.

In view of this, Japanese Laid-Open Patent Publication No. 2005-25819, for example, discloses a semiconductor memory device (e.g., a NAND-type flash memory) in which the cell array is formed by a plurality of cell array blocks each including a plurality of memory cells arranged therein to thereby increase the speed of the data read operation.

FIG. 19 is a timing chart showing the data read operation of the semiconductor memory device.

In the first read cycle in which the first region in the first cell array block is selected, the semiconductor memory device simultaneously performs the cell data read operation for the first region of the first cell array block and the cell data read operation for the second region of the second cell array block, and outputs the true busy signal from the busy signal generation circuit 11 during this period. In the following second read cycle in which the second region in the second cell array block is selected, the cell data read operation is not performed and the busy signal generation circuit 11 outputs a dummy busy signal RY/XBY="L", which is shorter than the true busy signal. Therefore, the busy period is shortened, and the speed of the data read operation is increased without changing the specifications of the NAND-type flash memory.

With a large-capacity NAND-type flash memory, however, in a case where data from a plurality of cell array blocks are read out sequentially or at random, the cell data read operation and the address latch operation for the data to be read out next are performed serially, and data accesses from outside are restricted during the cell data read operation (while the busy signal is being output), thereby making it difficult to realize a high-speed data read operation from the NAND-type flash memory. For example, when reading out a continuous piece of data that is written over a plurality of cell array blocks or when reading out and checking various status data written in all cell array blocks at power-on of the memory chip, it requires a long read time because access from outside is prohibited by the busy signal each time a cell array block is accessed.

In a write operation, a programming operation is performed serially with the write address latch operation and the data latch operation for the next programming operation, thus also lowering the write speed.

SUMMARY OF THE INVENTION

The present invention has been made in view of the problem set forth above, and has an object to provide a semiconductor memory device capable of a high-speed data read operation and a high-speed data write operation.

In order to achieve the object set forth above, the present invention makes it possible that a plurality of operations can be performed simultaneously in parallel to one another, instead of performing a series of processing operations, such as a data read operation and a data write operation, in series. Specifically, a first semiconductor memory device of the present invention is a semiconductor memory device, including: a cell array block including a plurality of memory cells arranged therein; and a controller, wherein the controller controls the semiconductor memory device so that: an operation of reading out data from a second region in the cell array block is initiated before completion of an operation of outputting data read out from a first region in the cell array block; and the data read out from the second region is output successively after the completion of the operation of outputting data read out from the first region.

A second semiconductor memory device of the present invention is the first semiconductor memory device, wherein: a read operation is initiated by latching from outside an address specifying the second region before the completion of the operation of outputting data read out from the first region; and the data read out from the second region is output successively after the completion of the operation of outputting data read out from the first region.

A third semiconductor memory device of the present invention is the second semiconductor memory device, wherein an address specifying the second region is latched in synchronism with an output control signal for controlling the operation of outputting data read out from the first region.

A fourth semiconductor memory device of the present invention is the third semiconductor memory device, wherein: the operation of outputting data read out from the first region is performed in synchronism with a first edge of the output control signal; and the address specifying the second region is latched in synchronism with a second edge of the output control signal.

A fifth semiconductor memory device of the present invention is the fourth semiconductor memory device, wherein after completion of the operation of latching the address specifying the second region, the operation of outputting data read out from the first region is performed in synchronism with the first and second edges of the output control signal.

A sixth semiconductor memory device of the present invention is the fourth semiconductor memory device, wherein after the completion of the operation of latching the address specifying the second region, the operation of outputting data read out from the first region continues to be performed in synchronism with the first edge of the output control signal.

A seventh semiconductor memory device of the present invention is the third semiconductor memory device, wherein: the operation of outputting data read out from the first region is performed in synchronism with a first cycle of the output control signal; and the address specifying the second region is latched in synchronism with a second cycle of the output control signal.

An eighth semiconductor memory device of the present invention is the seventh semiconductor memory device, wherein the first cycle and the second cycle alternate with each other.

A ninth semiconductor memory device of the present invention is the seventh semiconductor memory device, wherein after the completion of the operation of latching the address specifying the second region, the operation of outputting data read out from the first region is performed in synchronism with the first and second cycles of the output control signal.

A tenth semiconductor memory device of the present invention is the third semiconductor memory device, wherein the output control signal is a read enable signal.

An eleventh semiconductor memory device of the present invention is the third semiconductor memory device, wherein: the output control signal is a read enable signal; and the address latching operation is controlled further by a signal for controlling an address latching operation and an operation of latching input data stored in the cell array block.

A twelfth semiconductor memory device of the present invention is a semiconductor memory device, including: a cell array block including a plurality of memory cells arranged therein; and a controller, wherein the controller controls the semiconductor memory device so that second data and an address specifying a second region in the cell array block to which the second data is to be written are latched from outside during an operation of writing first data to a first region in the cell array block.

A thirteenth semiconductor memory device of the present invention is the twelfth semiconductor memory device, wherein the operation of latching from outside the address specifying the second region in the cell array block to which the second data is to be written is performed in synchronism with first and second edges of a first control signal.

A fourteenth semiconductor memory device of the present invention is a semiconductor memory device, including: a first address holding circuit for holding a first address signal, which is input at a first timing; a second address holding circuit for holding a second address signal, which is input at a second timing; and a controller, wherein the controller controls the semiconductor memory device so that the second address signal is input while output data is being output without changing a cycle of transferring the output data via a signal line for transferring the output data to outside.

A fifteenth semiconductor memory device of the present invention is the fourteenth semiconductor memory device, further including: a first edge detection circuit for detecting a first edge of a first signal for controlling an operation of transferring the output data to outside; a second edge detection circuit for detecting a second edge of the first signal; and a switching circuit for transferring the output data to outside in response to a detection signal from the first edge detection circuit and for latching the second address signal to the second address holding circuit in response to a detection signal from the second edge detection circuit.

A sixteenth semiconductor memory device of the present invention is the fourteenth semiconductor memory device, further including: a first cycle detection circuit for detecting a first cycle of a first signal for controlling an operation of transferring the output data to outside; a second cycle detection circuit for detecting a second cycle of the first signal; and a switching circuit for transferring the output data to outside in response to a detection signal from the first cycle detection circuit and for latching the second address signal to the second address holding circuit in response to a detection signal from the second cycle detection circuit.

A seventeenth semiconductor memory device of the present invention is the fifteenth semiconductor memory device, wherein the switching circuit is capable of comparing the first address signal and the second address signal with each other.

An eighteenth semiconductor memory device of the present invention is the sixteenth semiconductor memory device, wherein the switching circuit is capable of comparing the first address signal and the second address signal with each other.

A nineteenth semiconductor memory device of the present invention is a semiconductor memory device, including: a cell array block including a plurality of memory cells arranged therein; a first address holding circuit for holding a first address signal specifying a first region in the cell array block, the first address signal being input at a first timing; a first data holding circuit for holding first data to be written to the first region, the first data being input at a second timing; a second address holding circuit for holding a second address signal specifying a second region in the cell array block, the second address signal being input at a third timing; and a second data holding circuit for holding second data to be written to the second region, the second data being input at a fourth timing, wherein the second address signal and the second data are latched to the second address holding circuit and the second data holding circuit, respectively, via a common signal line before completion of an operation of writing the first data to the first region.

A twentieth semiconductor memory device of the present invention is a semiconductor memory device, including: a cell array block including a plurality of memory cells arranged therein; a first address holding circuit for holding a first address signal specifying a first region in the cell array block, the first address signal being input at a first timing; a first data holding circuit for holding first data to be written to the first region, the first data being input at a second timing; a second address holding circuit for holding a second address signal specifying a second region in the cell array block, the second address signal being input at a third timing; and a second data holding circuit and a third data holding circuit for holding second data to be written to the second region, the second data being input at a fourth timing, wherein: the second address signal and the second data are held by the second address holding circuit and the third data holding circuit via a common signal line before completion of an operation of writing the first data to the first region; and the second data held by the third data holding circuit is latched to the second data holding circuit after the second address signal is held by the second address holding circuit.

A first semiconductor device of the present invention is a semiconductor device, including: the first, twelfth, fourteenth, nineteenth or twentieth semiconductor memory device; and a control circuit for outputting a control signal, a data signal and an address specifying signal to the semiconductor memory device, and for receiving a data output signal from the semiconductor memory device, wherein: a data transfer of the address specifying signal and an input/output signal between the control circuit and the semiconductor memory device is performed via a common signal line in synchronism with the control signal; the data output signal from the semiconductor memory device is received in synchronism with a first edge or a first cycle of the control signal; and the control circuit outputs the address specifying signal in synchronism with a second edge or a second cycle of the control signal.

A second semiconductor device of the present invention is the first semiconductor device further including a host circuit for outputting an instruction signal, wherein the control circuit receives an instruction signal from the host circuit to output the control signal, the data signal and the address specifying signal to the semiconductor memory device, and receives the data output signal from the semiconductor memory device.

A third semiconductor device of the present invention is a semiconductor device, including: the first, twelfth, fourteenth, nineteenth or twentieth semiconductor memory device; and a control circuit for outputting a control signal, a data signal and an address specifying signal to the semiconductor memory device, and for receiving a data output signal from the semiconductor memory device, wherein: a data transfer of the address specifying signal and an input/output signal between the control circuit and the semiconductor memory device is performed via a common signal line in synchronism with the control signal; and the data output signal is output to the semiconductor memory device in synchronism with first and second edges of the control signal.

A fourth semiconductor device of the present invention is the third semiconductor device, further including a host circuit for outputting an instruction signal, wherein the control circuit receives an instruction signal from the host circuit to output the control signal, the data signal and the address specifying signal to the semiconductor memory device, and receives the data output signal from the semiconductor memory device.

The semiconductor memory device may be a NAND-type flash memory, for example.

Thus, without changing the specifications of the pins of a NAND-type flash memory, or the like, for example, processing operations, which were performed serially in a read operation, can be performed in parallel to one another, by performing the address latch operation for the second region during the readout data outputting operation for the first region in a read operation or by performing the address latch operation for the second region during the cell data read operation for the first region. Moreover, processing operations, which were performed serially in a write operation, can be performed in parallel to one another, by performing the address latch operation or the data latch operation for the following data programming operation during a data programming operation in a write operation.

DETAILED DESCRIPTION OF THE PREFERRED EMBODIMENTS

Figure 1:
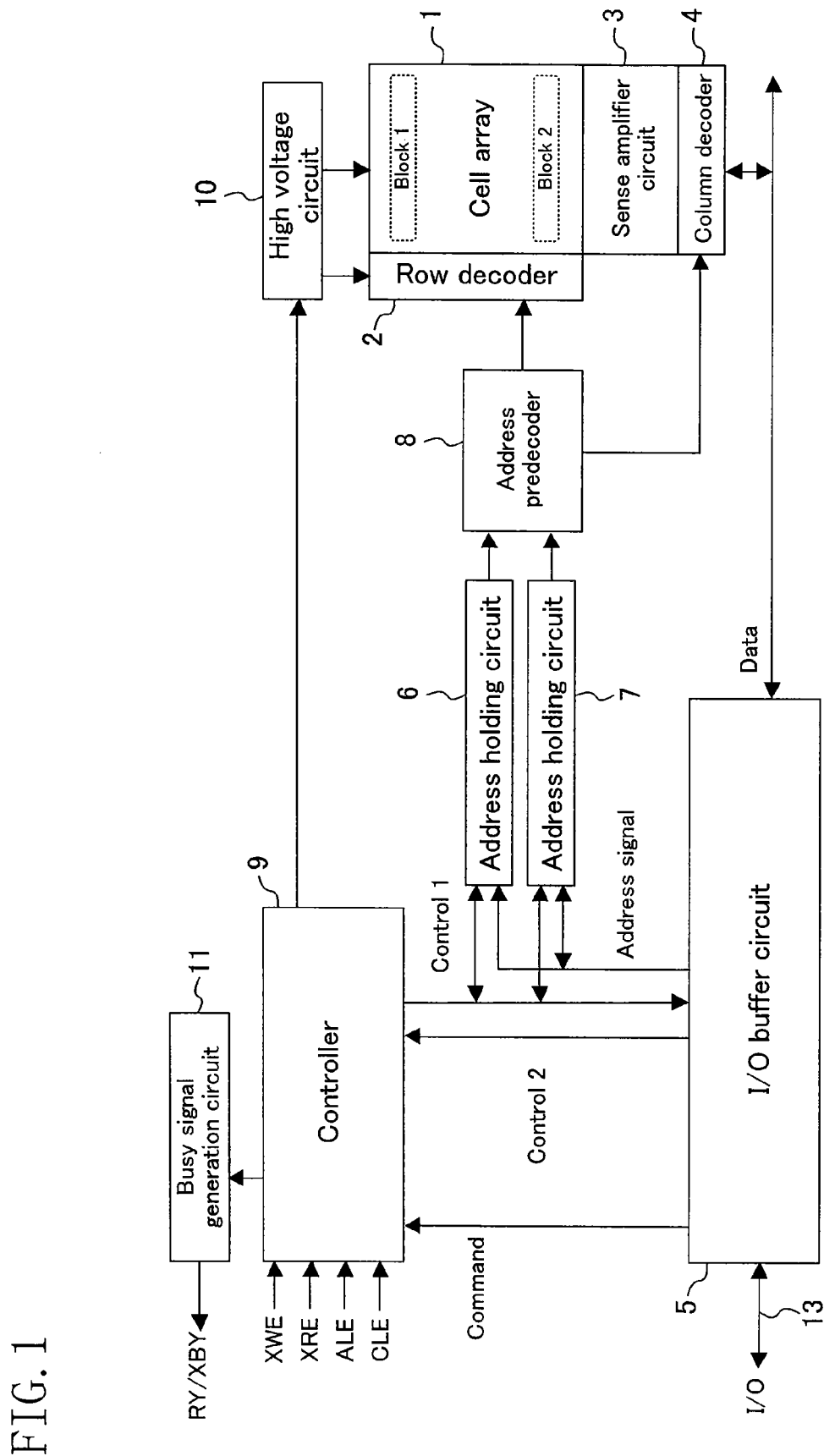
FIG. 1 is a block diagram showing a general configuration of a NAND-type flash memory according to a first embodiment of the present invention.

Semiconductor memory devices and semiconductor devices (electronic devices) of preferred embodiments of the present invention will now be described with reference to the drawings. In each embodiment, like elements in function to those of other embodiments will be denoted by like reference numerals and will not be described redundantly.

First Embodiment

A first embodiment of the present invention will now be described with reference to the drawings.

FIG. 1 is a block diagram showing a general configuration of a NAND-type flash memory according to the first embodiment of the present invention.

Referring to FIG. 1, a cell array 1 includes a plurality of floating gate-type memory cells arranged in a matrix pattern. A row decoder (including the word line driver) 2 is responsible for selecting a block of the cell array 1, selectively driving a word line, and selectively driving a selected gate line. A sense amplifier circuit 3 forms a page buffer circuit including a page's worth of sense amplifiers for sensing the bit line data of the cell array 1.

A page of readout data is selected by a column decoder (column gate) 4 and is output to an I/O line 13 via an I/O buffer circuit 5. Write data supplied from the I/O line 13 is transferred to the sense amplifier circuit 3 as selected by the column decoder 4. An address signal is input to address holding circuits 6 and 7 via the I/O buffer circuit 5, and a row address and a column address are transferred to the row decoder 2 and the column decoder 4, respectively, via an address predecoder 8.

The I/O buffer circuit 5 is capable of comparing a previously-latched address with another subsequently-latched address. If the addresses are different from each other, the I/O buffer circuit 5 transfers the subsequently-latched address to one of the address holding circuits 6 and 7 that is not holding the previously-latched address.

Moreover, the I/O buffer circuit 5 detects a falling edge, a rising edge and/or a fall-rise cycle of the read enable signal XRE, based on which the operation of outputting the readout data to the I/O line 13 or the operation of latching the address received from the I/O line 13 to the address holding circuits 6 and 7 can be selectively controlled.

A controller 9 outputs internal timing signals for the read operation, the write operation and the erase operation based on control signals such as a write enable signal XWE, a read enable signal XRE, an address latch enable signal ALE and a command latch enable signal CLE. Based on the internal timing signals, the sequence operation of the data read operation, the data write operation and the data erase operation is controlled. Moreover, the controller 9 detects edges and cycles of the control signal.

The high voltage circuit 10 is controlled by the controller 9 to produce a different voltage depending on the operation being performed, i.e., the read operation, the write operation or the erase operation. A busy signal generation circuit 11 outputs a busy signal RY/XBY for indicating, to the outside of the chip, the access status of the cell array 1, depending on the operation being performed, i.e., the read operation, the write operation or the erase operation.

Figure 2:
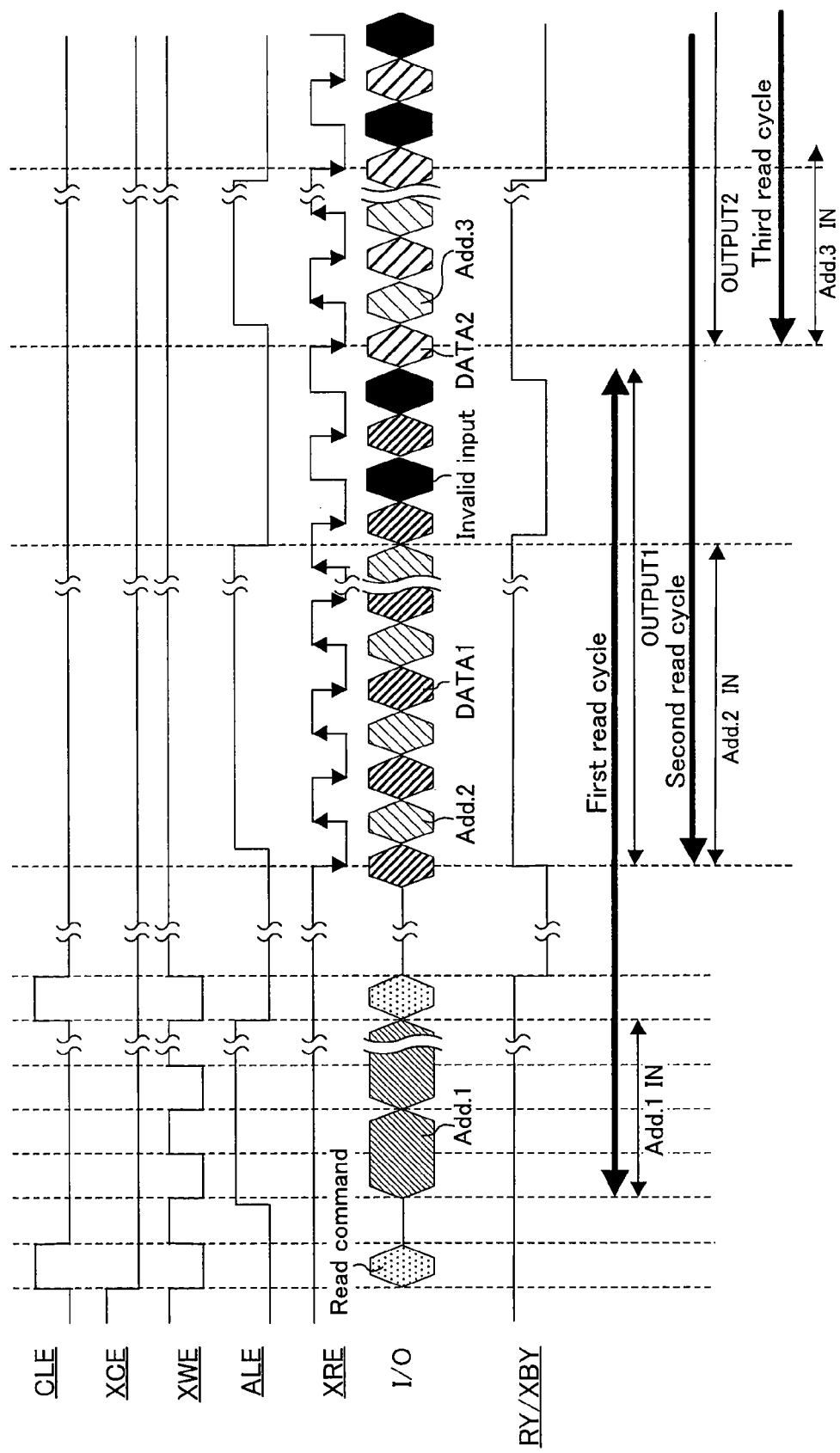
FIG. 2 is a timing chart showing a data read operation of the NAND-type flash memory where there are a chain of read cycles.

FIG. 2 is a timing chart showing a data read operation of the NAND-type flash memory of the present embodiment where there are a chain of read cycles.

A cycle of a data read operation includes a cell data read operation of reading out data from the cell array 1 to the sense amplifier circuit 3, and a readout data outputting operation of outputting data, which has been read out to the sense amplifier circuit 3, to outside the chip. In a read cycle, an address Add that specifies a page is input based on the write enable signal XWE and the address latch enable signal ALE, thus initiating the cell data read operation. While the cell data is being read out to the sense amplifier circuit 3, the busy signal RY/XBY="L" is output. After the completion of the cell data read operation, the busy signal RY/XBY goes "H", and then the read enable signal XRE is input, thus initiating the readout data outputting operation.

In the first read cycle, the address latch operation (Add.1 IN), the cell data read operation and the readout data outputting operation (OUTPUT 1) are performed serially. However, during the readout data outputting operation (OUTPUT 1), another address latch operation (Add.2 IN) specifying the access destination for the second read cycle is performed using the same pins as those used in the data outputting operation. More specifically, the address latch enable signal ALE is brought to "H", after which data is output at the falling edge of the data output controlling signal XRE and an address specifying the access destination for the second read cycle is latched at the rising edge thereof.

In a case where data still needs to be output after the address data latch operation is completed, the address latch enable signal ALE is brought to "L", thus making only the data outputs valid and stopping the address latch operation at the rising edges of the data output controlling signal XRE. This results in a normal data output operation.

During this period, the cell data read operation for the second read cycle is performed. Then, the readout data is output following the data output of the first read cycle. At this point, the address latch operation (Add.3 IN) for the following third read cycle is performed.

As described above, externally specifying the next address does not require a separate address latch sequence, and it is therefore possible to increase the speed of the read operation. Moreover, data are read out uninterrupted, which facilitates the data processing operations of the system.

Figure 3:
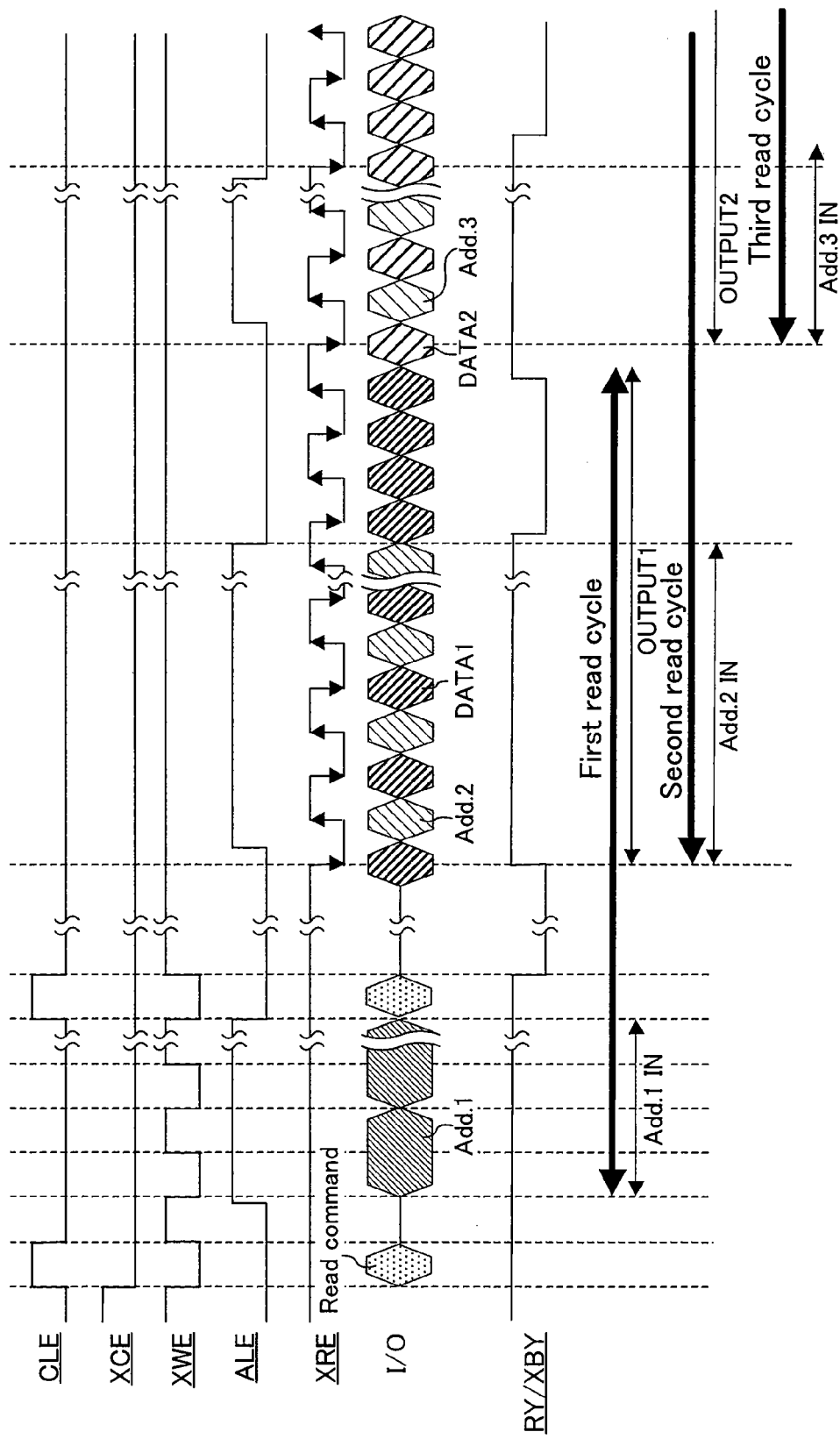
FIG. 3 is a timing chart showing another data read operation of the NAND-type flash memory where there are a chain of read cycles.

FIG. 3 is a timing chart showing another data read operation of the NAND-type flash memory of the present embodiment where there are a chain of read cycles.

Referring to FIG. 3, in a case where data still needs to be output after the address data latch operation is completed, the address latch enable signal ALE is brought to "L", thereby making both edges of the data output controlling signal XRE valid for the data outputs, instead of making only one edge of the data output controlling signal XRE valid as shown in FIG. 2. Thus, data are output at both rising and falling edges.

As described above, externally specifying the next address does not require a separate address latch sequence, and the speed of the data output is doubled, thus further increasing the speed of the read operation.

Figure 4:
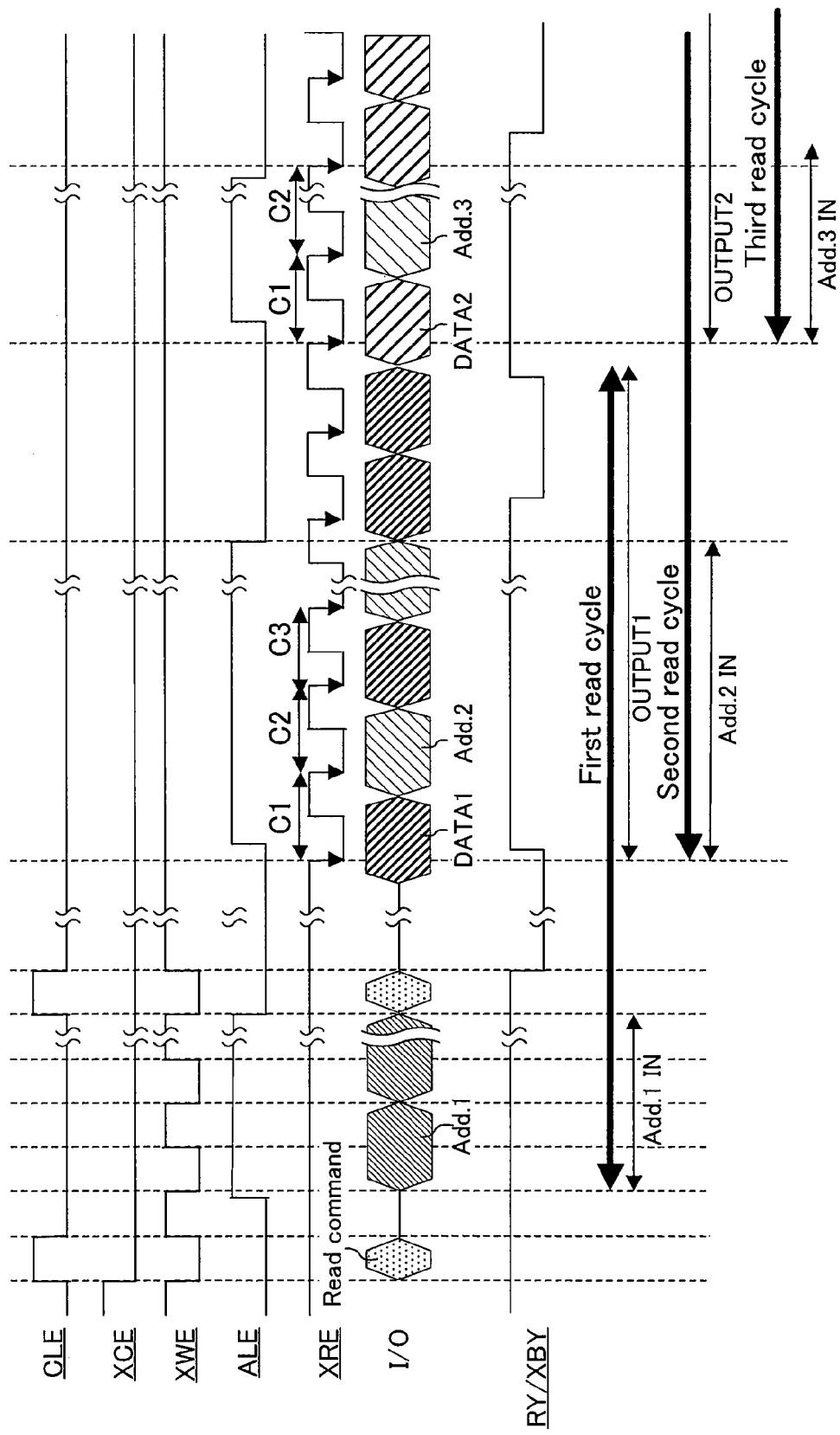
FIG. 4 is a timing chart showing still another data read operation of the NAND-type flash memory where there are a chain of read cycles.

FIG. 4 is a timing chart showing still anther data read operation of the NAND-type flash memory of the present embodiment where there are a chain of read cycles.

Referring to FIG. 4, during the readout data outputting operation (OUTPUT 1), and the address specifying the access destination for the following second read cycle using data output pins (and the readout data outputting operation is performed in parallel to the cell data read operation of the next cycle), as is also the case with the examples shown in FIGS. 2 and 3. However, the example shown in FIG. 4 is different in that the readout data outputting operation is performed during the first (C1) and the third (C3) of the "H"-"L" cycles of the data output controlling signal XRE, and the address specifying the access destination for the second read cycle is latched during the second cycle (C2). Specifically, the data output operation and the address latch operation alternate each other by cycles. This is also realized by bringing the address latch enable signal ALE to "H" in synchronism with the data output operation based on the data output controlling signal XRE.

In a case where data still needs to be output after the address data latch operation is completed, the address latch enable signal ALE is brought to "L", thus performing only the data output operation.

As described above, externally specifying the next address does not require a separate address latch sequence, and the speed of the read operation can be increased. Moreover, the operating speed (frequency) of the unit that supplies addresses and outputs data via the common I/O line 13 does not need to be increased as does in the examples shown in FIGS. 2 and 3. Thus, it is possible to reduce the burden in terms of the operating speed.

Second Embodiment

A second embodiment of the present invention will now be described with reference to the drawings.

A semiconductor memory device of the present embodiment, having a similar circuit configuration to that of the first semiconductor memory device, operates as follows.

Figure 5:
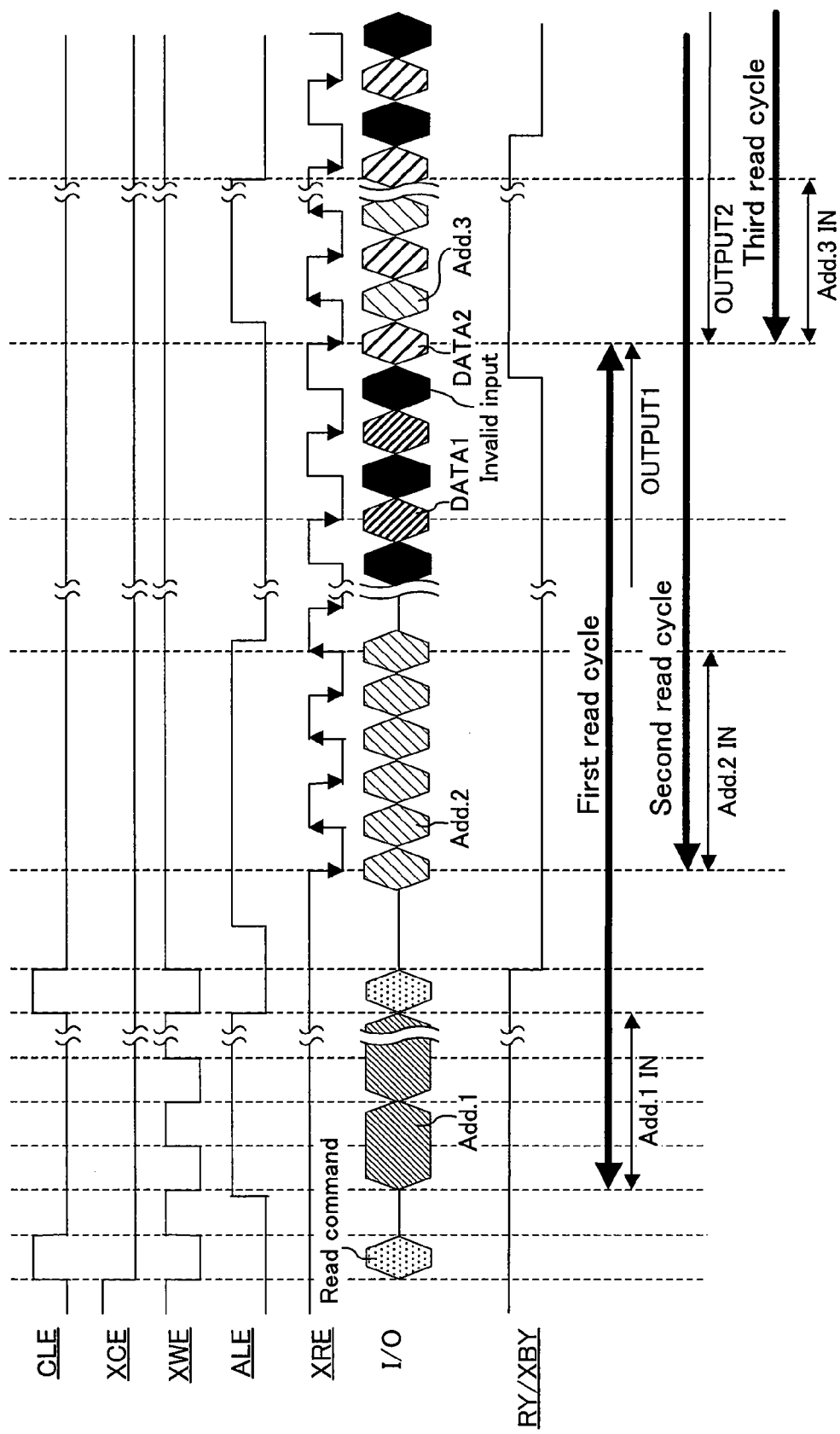
FIG. 5 is a timing chart showing a data read operation of a NAND-type flash memory according to a second embodiment of the present invention where there are a chain of read cycles.

FIG. 5 is a timing chart showing a data read operation of the NAND-type flash memory of the present embodiment where there are a chain of read cycles.

Referring to FIG. 5, while the busy signal RY/XBY="L" is being output during the cell data read operation in the first read cycle, the address latch operation (Add.2 IN) for specifying the access destination for the following cycle is performed using data output pins. Then, the address latch operation for specifying the access destination for the next cycle can be started without waiting for the completion of the cell data read operation in the first read cycle, as in the conventional example and in the first embodiment, thus realizing a configuration that is even easier to use. Also in this example, the address latch enable signal ALE is brought to "H", and the external address is latched in synchronism with the data output controlling signal XRE.

Figure 6:
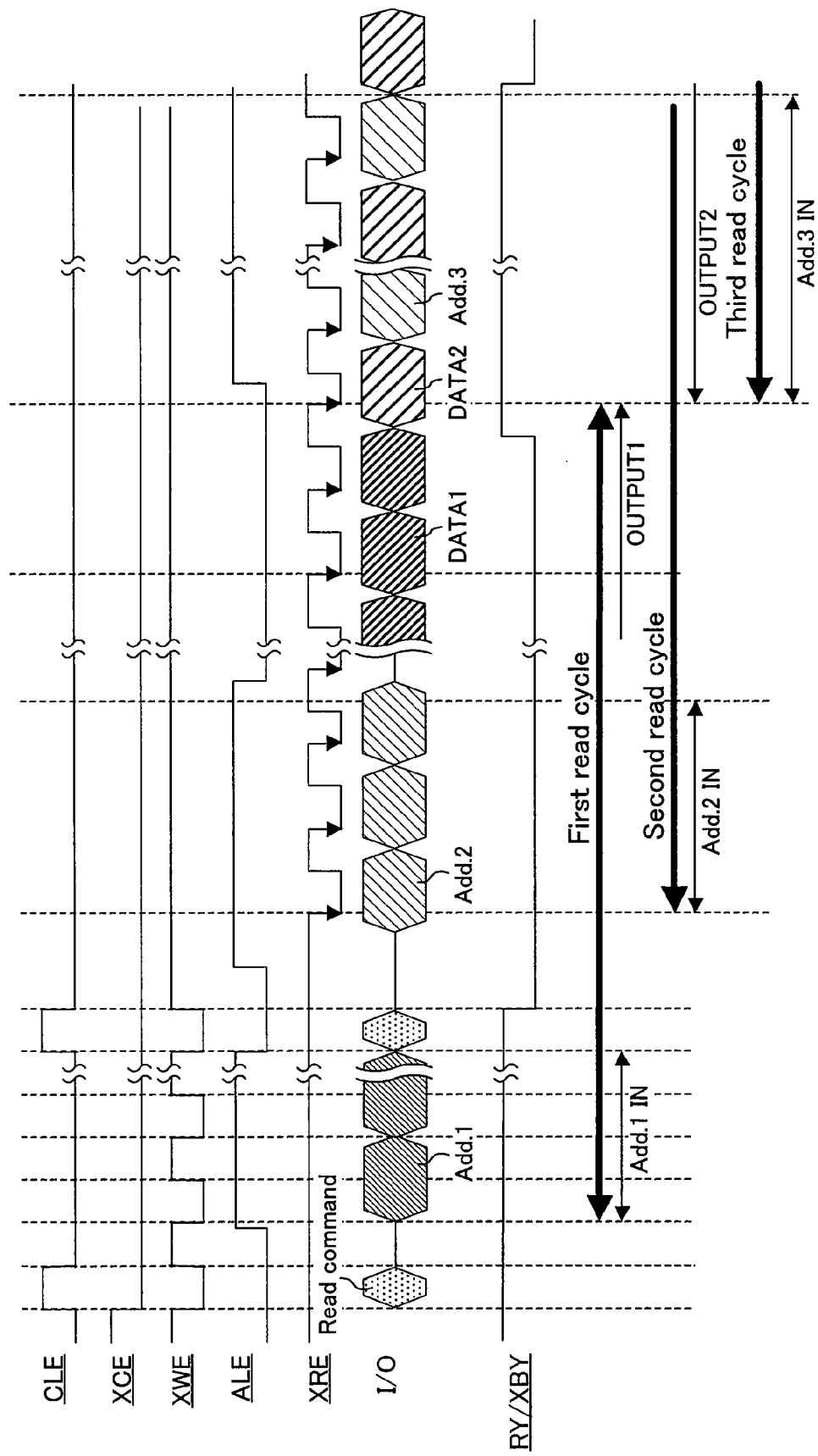
FIG. 6 is a timing chart showing another data read operation of the NAND-type flash memory where there are a chain of read cycles.

FIG. 6 is a timing chart showing another data read operation of the NAND-type flash memory of the present embodiment where there are a chain of read cycles.

Referring to FIG. 6, the address specifying the access destination for the next cycle is latched at the falling edge of the data output controlling signal XRE, for example. Again, the operating speed (frequency) of the unit that supplies addresses and outputs data via the common I/O line 13 does not need to be increased, and thus it is possible to reduce the burden in terms of the operating speed.

As described above, externally specifying the next address does not require a separate address latch sequence, whereby the speed of the read operation can be increased, and the address latch timing in the first read cycle is expanded, thus realizing a configuration that is easier to use.

Figure 7:
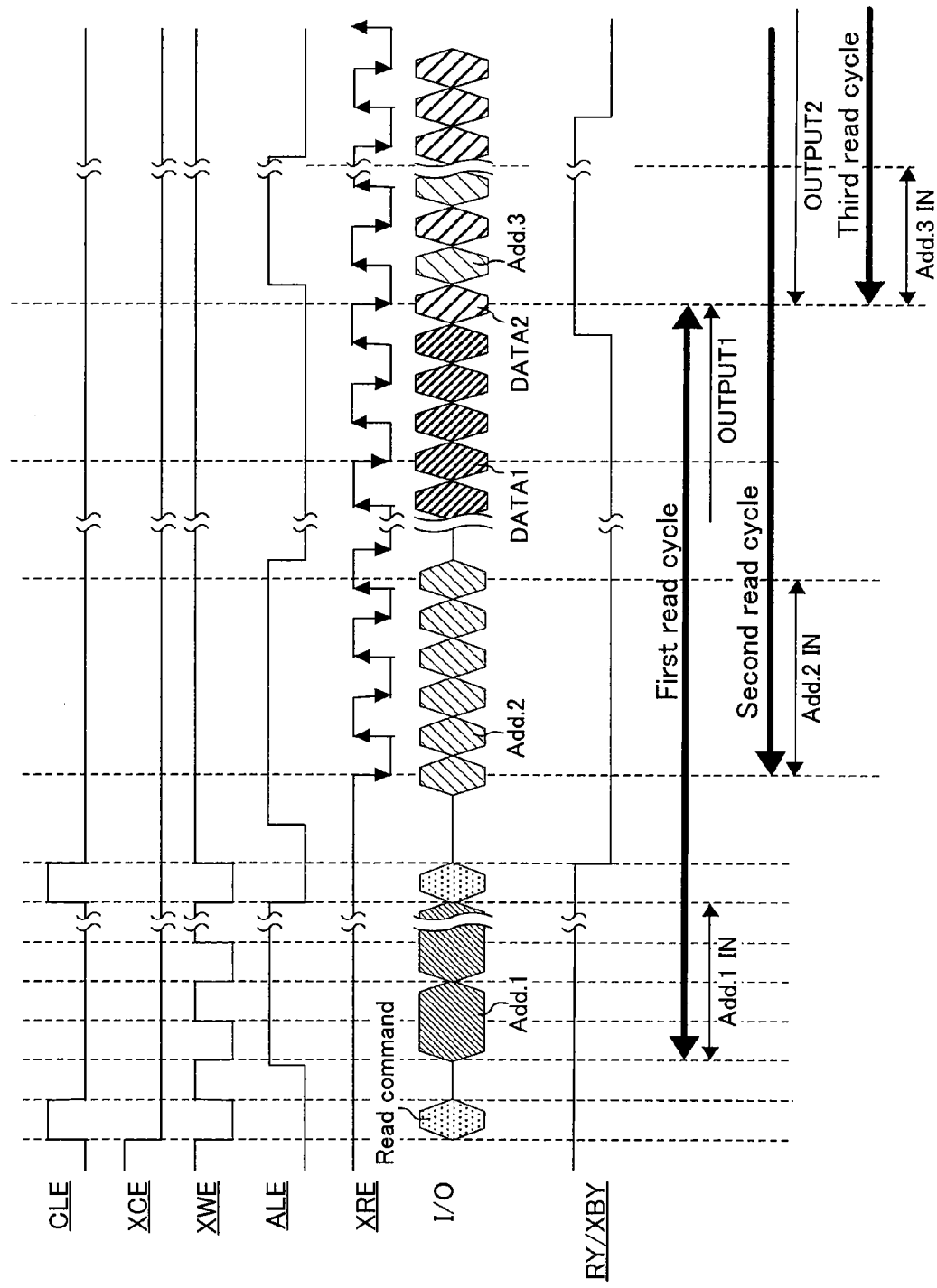
FIG. 7 is a timing chart showing still another data read operation of the NAND-type flash memory where there are a chain of read cycles.

FIG. 7 is a timing chart showing still anther data read operation of the NAND-type flash memory of the present embodiment where there are a chain of read cycles.

Referring to FIG. 7, in the readout data outputting operation after the completion of the address data latching operation for the first read cycle, data are output at both rising and falling edges of the data output controlling signal XRE, as compared with the timing chart shown in FIG. 5.

As described above, when externally specifying the next address, the address latch timing in the first read cycle is expanded, and the operation does not require a separate address latch sequence. Moreover, the speed of the data output is doubled, thus enabling an increase in the speed of the read operation.

In the first and second embodiments, the address latch operation for specifying the access destination for the next cycle is performed by using the same pins as those used for outputting data in the readout data outputting operation. However, it is understood that separate address pins may be added.

The readout data outputting operation and the operation of latching the address for the next cycle, which are performed by using both rising and falling edges of the data output controlling signal XRE, may be controlled by separately configuring the operation of the flash memory instead of using only the address latch enable signal ALE.

While the operation of latching the address specifying the access destination for the next cycle is performed based on the existing read enable signal XRE, it is understood that the operation may be performed by using other existing control signals or by adding a control signal therefor.

As described above, in the first and second embodiments, as compared with the timing of the address latch and data output of the read operation of the conventional NAND-type flash memory, the address latch operation is performed during the data read operation in the first read cycle or performed in parallel to the data outputting operation for the previous access, thus eliminating the need for a separate address latch sequence and enabling an increase in the read operation. Therefore, there is a significant advantage in increasing the operation speed especially when reading out a block of data, which is written over different page regions or different block regions.

Third Embodiment

A third embodiment of the present invention will now be described with reference to the drawings.

Figure 8:
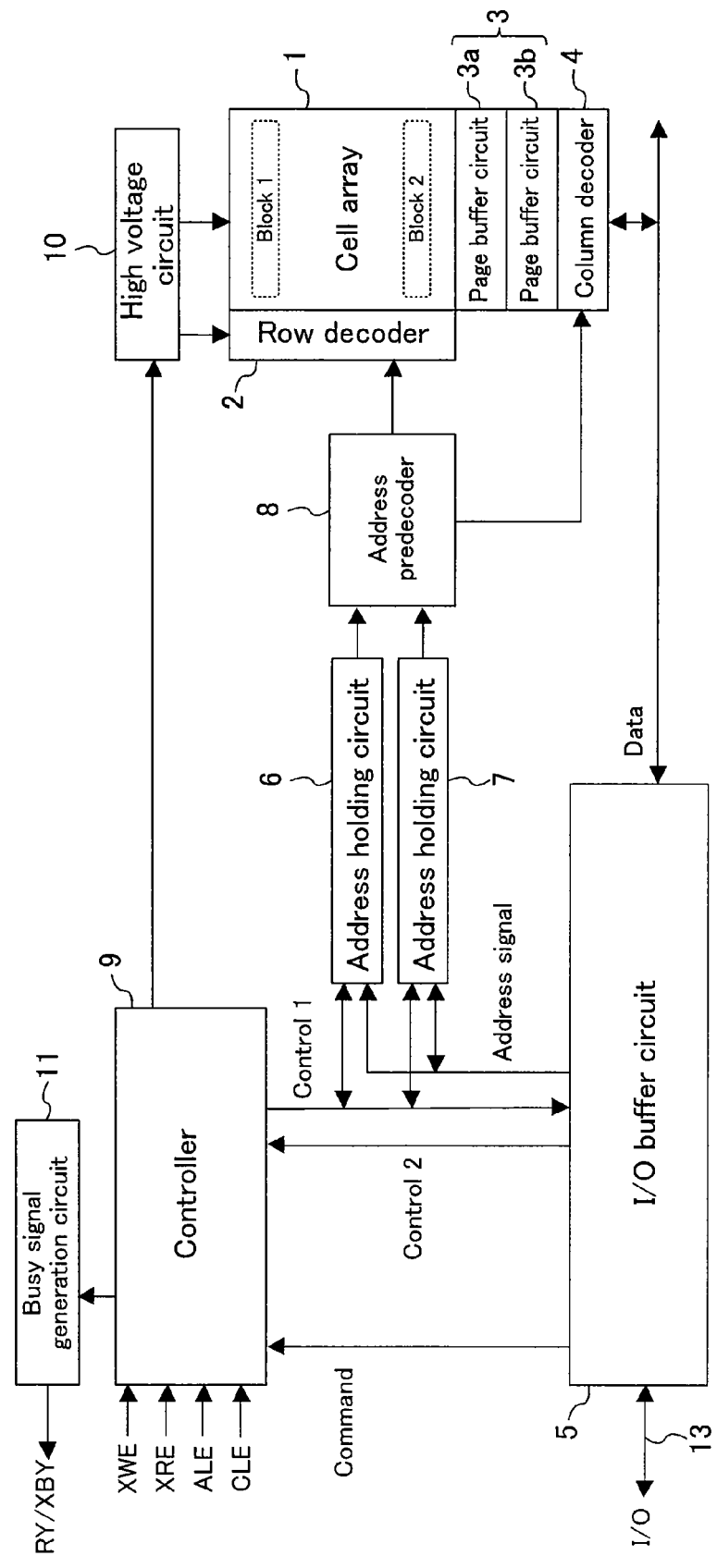
FIG. 8 is a block diagram showing a general configuration of a NAND-type flash memory according to a third embodiment of the present invention.

FIG. 8 is a block diagram showing a general configuration of a NAND-type flash memory according to the third embodiment of the present invention.

The NAND-type flash memory of the present embodiment differs from that of the first embodiment in that two page buffer circuits 3a and 3b are provided in the sense amplifier circuit 3. The NAND-type flash memory of the present embodiment, having an otherwise similar configuration to that of the first embodiment, operates as follows.

Figure 9:
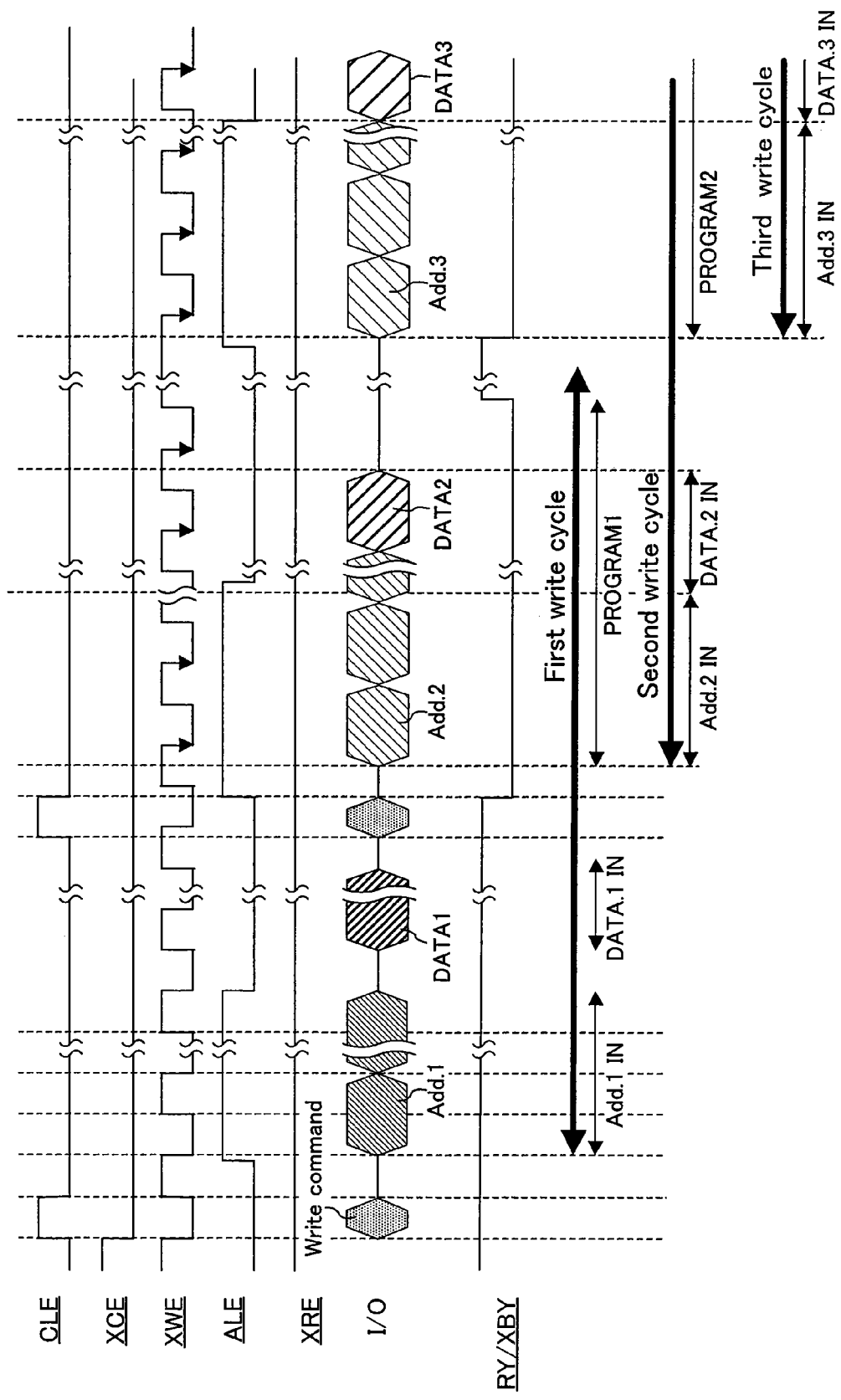
FIG. 9 is a timing chart showing a data write operation of a NAND-type flash memory where there are a chain of write cycles.

FIG. 9 is a timing chart showing a data write operation of the NAND-type flash memory of the present embodiment where there are a chain of write cycles.

A cycle of a data write operation includes an operation of latching from outside the address specifying the write destination page and data to be written therein (the address-data latch operation) and the operation of transferring the latched data to the sense amplifier circuit 3 and then transferring and programming the data to the cell array 1 (the programming operation). The busy signal RY/XBY="L" is output during the programming operation. The busy signal RY/XBY goes "H" when the programming operation is completed.

In the first write cycle, the address-data latch operation and the programming operation are performed serially. The address-data latch operation for specifying the access destination for the following second write cycle is performed by using data output pins during the programming operation in the first write cycle. For example, the address latch and the data latch are performed at the falling edges of the address-data input controlling signal XWE. It is herein specified that an address is latched when the address latch enable signal ALE="H" and data is latched when the address latch enable signal ALE="L". Then, one of the page buffer circuits 3a and 3b provided in the NAND-type flash memory is selected based on the column address of the latched address, and the latched data is held at the selected page buffer circuit. The programming operation for the second write cycle is initiated following the completion of the programming operation for the first write cycle. The data write operation can be verified by confirming the completion of the programming operation by reading out the status after the completion of the programming operation.

As described above, according to the present embodiment, in a case where there are a chain of write cycles, the operation of specifying from outside the access destination address and the data to be written for the next cycle is performed in parallel to the programming operation for the preceding cycle, thereby eliminating the need for a separate address-data latch operation, which was performed serially in the prior art, and thus increasing the speed of the write operation.

Fourth Embodiment

A fourth embodiment of the present invention will now be described with reference to the drawings.

Figure 10:
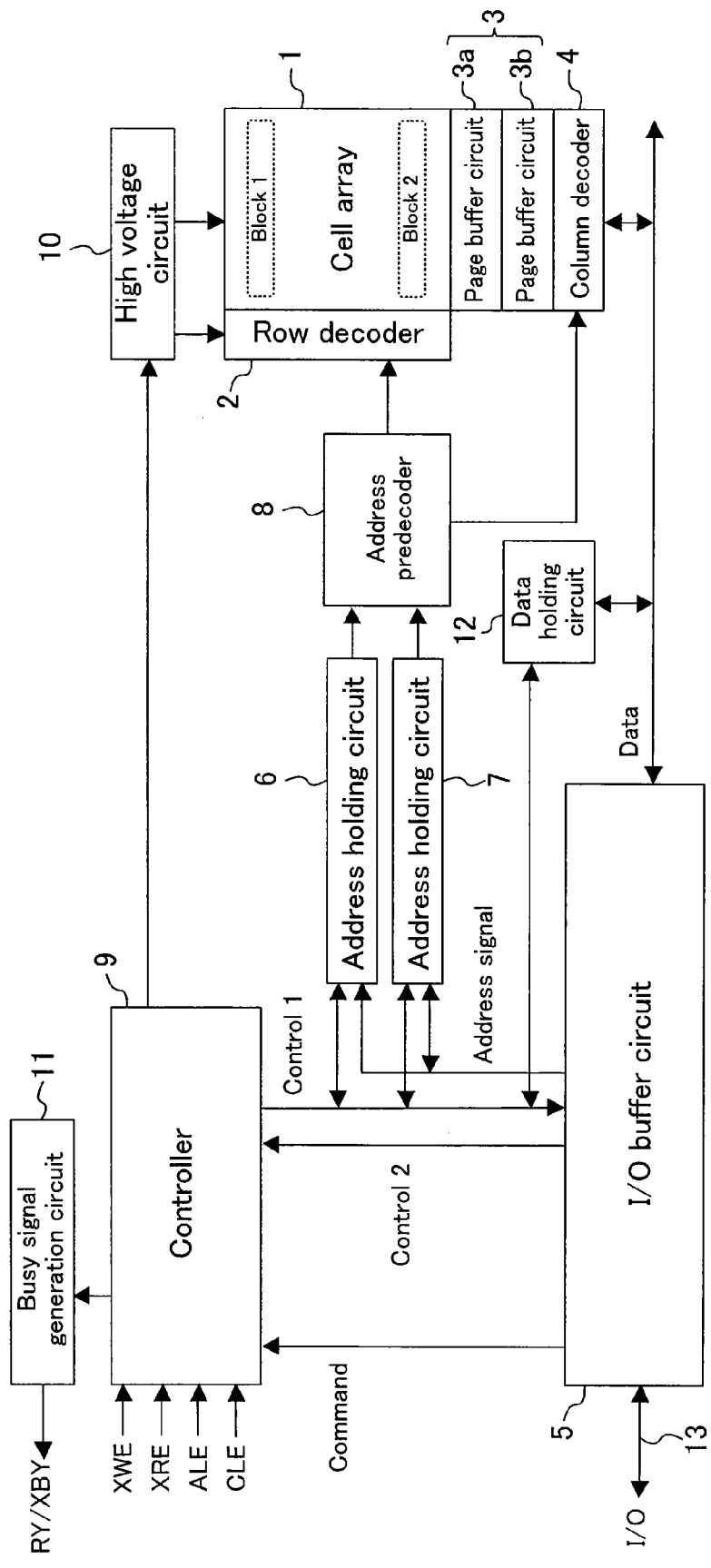
FIG. 10 is a block diagram showing a general configuration of a NAND-type flash memory according to a fourth embodiment of the present invention.

FIG. 10 is a block diagram showing a general configuration of a NAND-type flash memory according to a fourth embodiment of the present invention.

The NAND-type flash memory of the present embodiment differs from that of the third embodiment in that a data holding circuit 12 is provided between the sense amplifier circuit 3 and the I/O buffer circuit 5. The data holding circuit 12 holds data to be written, which has been latched with its write destination address being undefined, for a certain period of time until the write destination address is determined. After the completion of the address latch, the data being held therein is transferred to the sense amplifier circuit 3 in which a plurality of page buffer circuits 3a and 3b are provided, and is then written to cells by the programming operation for the second write cycle, which follows the completion of the programming operation for the first write cycle. The data write operation can be verified by confirming the completion of the programming operation by reading out the status after the completion of the programming operation.

The memory of the present embodiment, having an otherwise similar configuration to that of the first embodiment, operates as follows.

Figure 11:
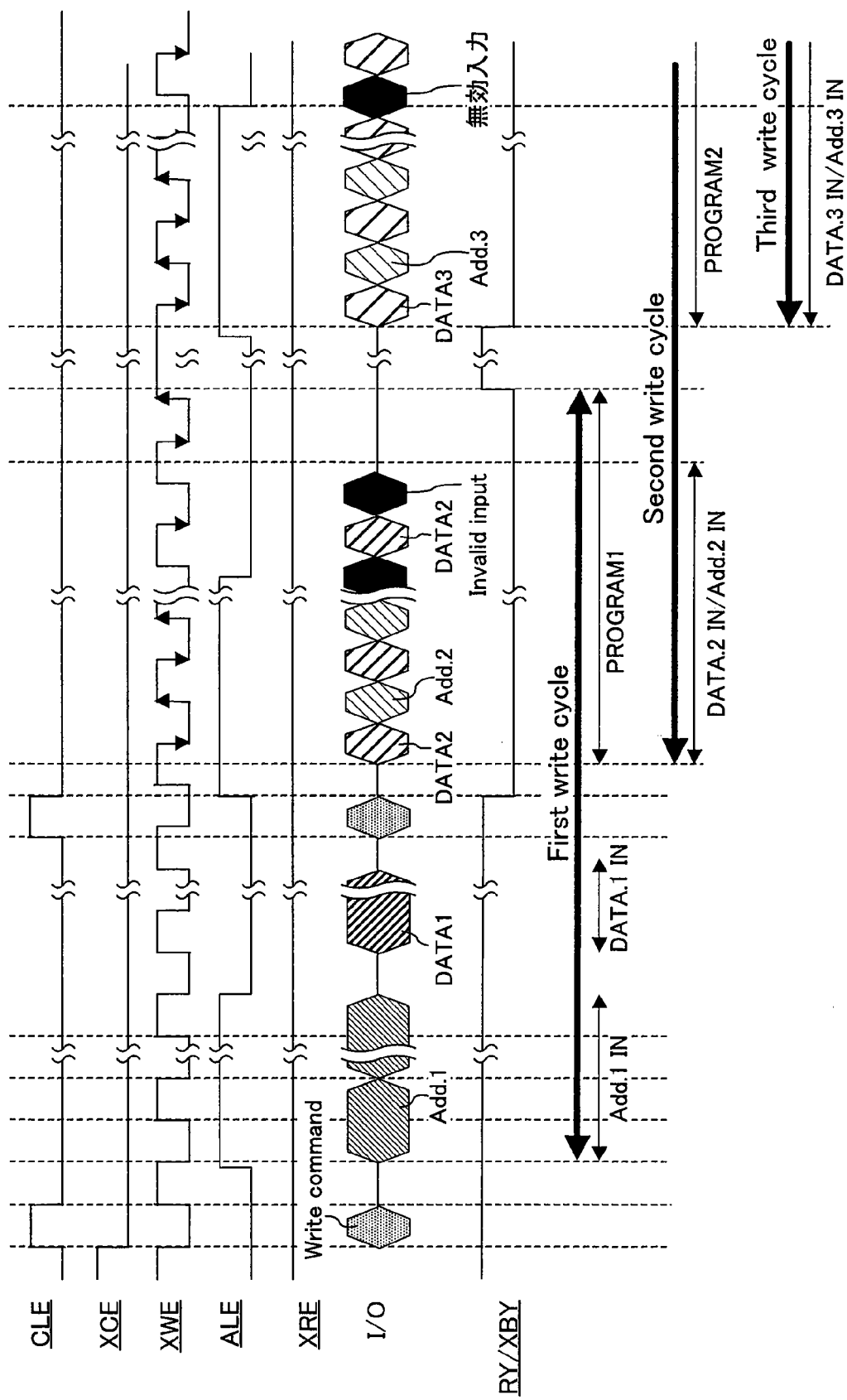
FIG. 11 is a timing chart showing a data write operation of a NAND-type flash memory where there are a chain of write cycles.

FIG. 11 is a timing chart showing a data write operation of the NAND-type flash memory of the present embodiment where there are a chain of write cycles.

In the first write cycle, the address-data latch operation (Add.1 IN, DATA.1 IN) and the programming operation (PROGRAM 1) are performed serially. The address-data latch operation (Add.2 IN, DATA.2 IN) for specifying the access destination for the following second write cycle is performed by using data output pins during the programming operation in the first write cycle. For example, data is latched at the falling edge of the address-data input controlling signal XWE and an address is latched at the rising edge thereof. More specifically, it is herein specified that data and an address are latched at the falling edge of the signal XWE and at the rising edge thereof, respectively, while the address latch enable signal ALE is "H". On the other hand, while the address latch enable signal ALE is "L", only the falling edge of the signal XWE is valid, at which data is latched, and the address latch operation is not performed at the rising edge thereof.

Figure 12:
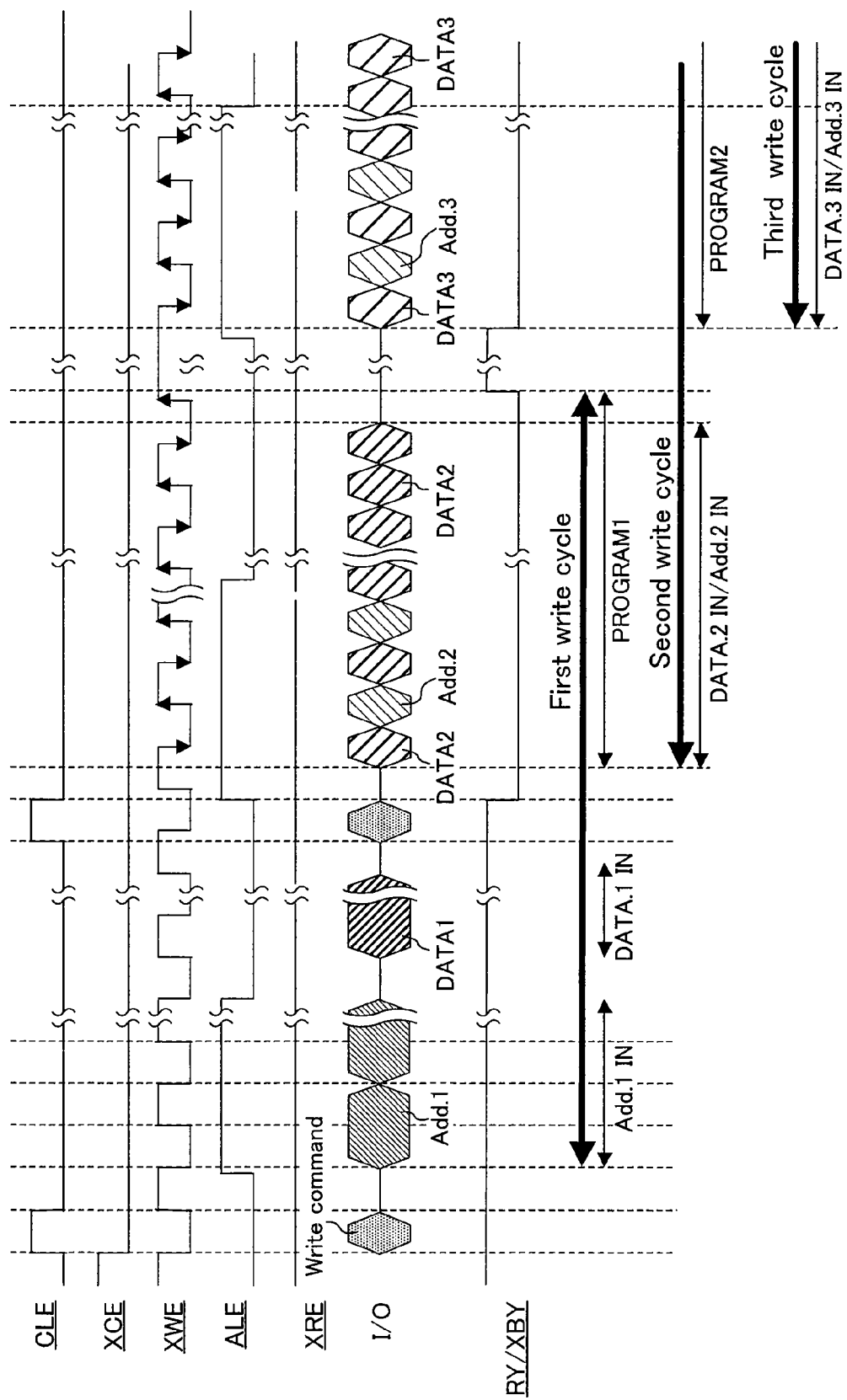
FIG. 12 is a timing chart showing another data write operation of the NAND-type flash memory where there are a chain of write cycles.

FIG. 12 is a timing chart showing another data write operation of the NAND-type flash memory of the present embodiment where there are a chain of write cycles.

Referring to FIG. 12, it is specified that while the address latch enable signal ALE is "H", data and an address are latched at the falling edge of the signal XWE and at the rising edge thereof, respectively. While the address latch enable signal ALE is "L", data is latched at both rising and falling edges.

Figure 13:
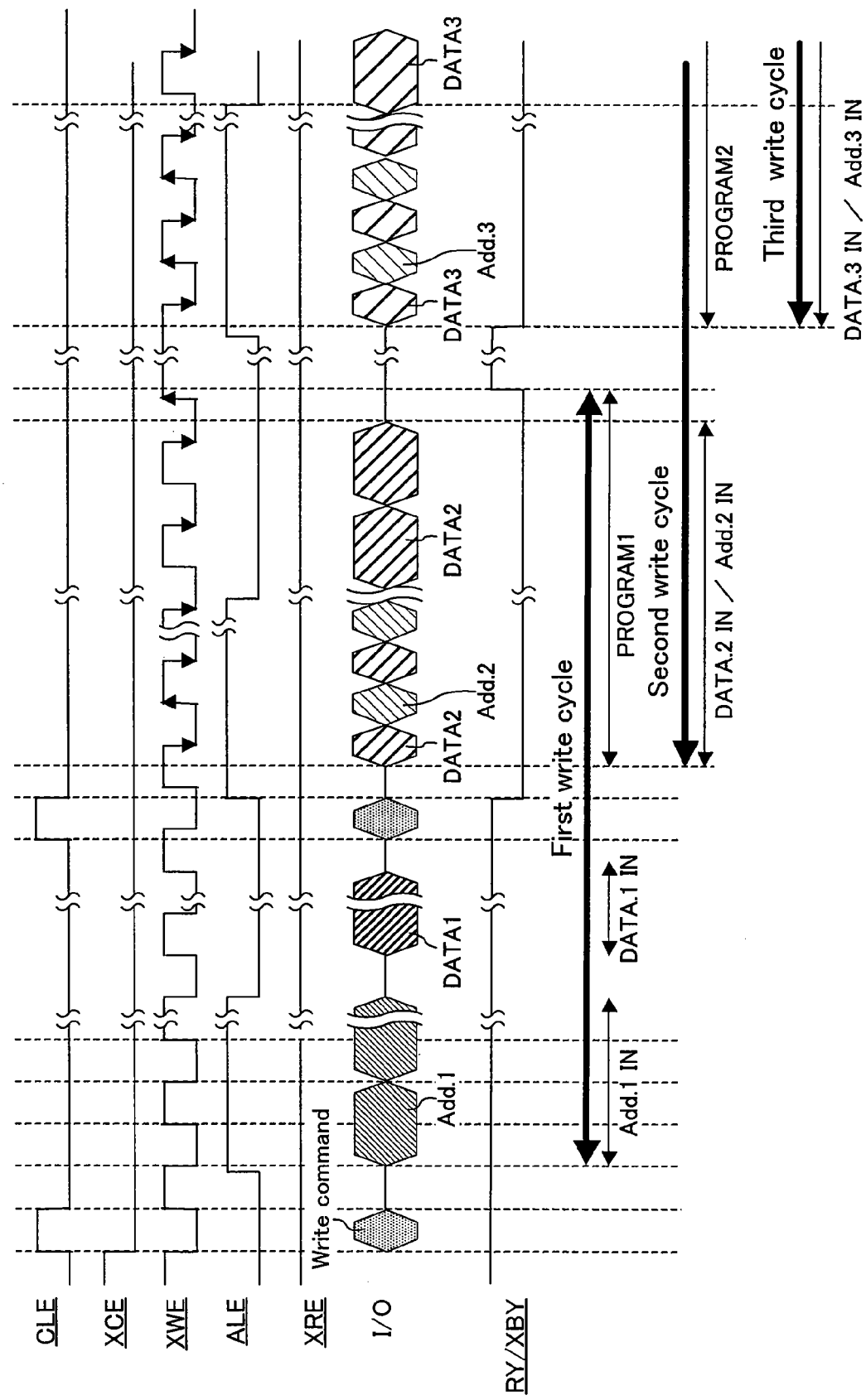
FIG. 13 is a timing chart showing still another data write operation of the NAND-type flash memory where there are a chain of write cycles.

FIG. 13 is a timing chart showing still another data write operation of the NAND-type flash memory of the present embodiment where there are a chain of write cycles.

FIG. 13 shows an example where data and an address are latched at the falling edge of the address-data input controlling signal XWE and at the rising edge thereof, respectively. More specifically, it is herein specified that data and an address are latched at the falling edge of the signal XWE and at the rising edge thereof, respectively, while the address latch enable signal ALE is "H". On the other hand, while the address latch enable signal ALE is "L", only the falling edge of the signal XWE is valid, at which data is latched. Thus, each piece of data is latched over one cycle of the address-data input controlling signal XWE.

Figure 14:
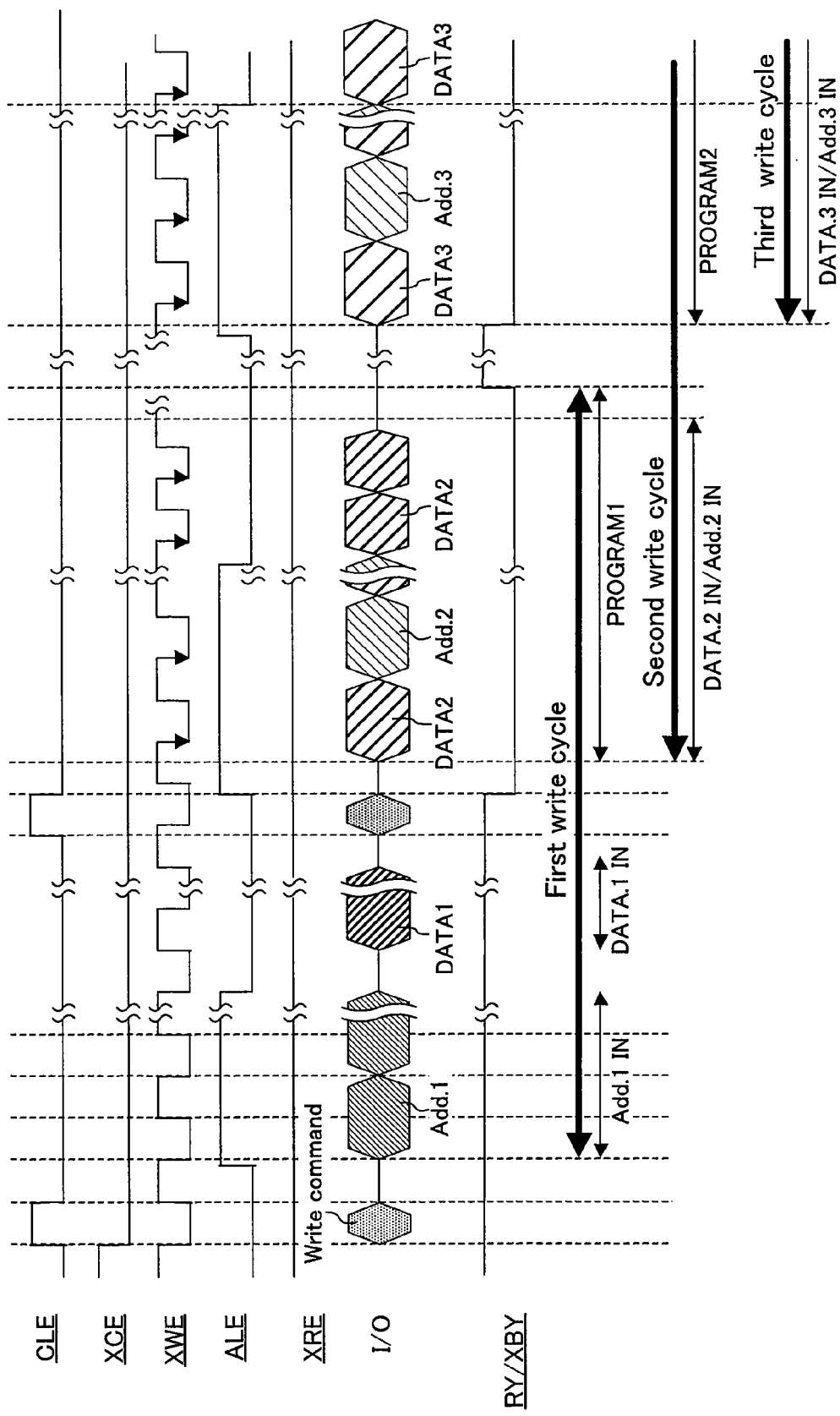
FIG. 14 is a timing chart showing yet another data write operation of the NAND-type flash memory where there are a chain of write cycles.

FIG. 14 is a timing chart showing yet another data write operation of the NAND-type flash memory of the present embodiment where there are a chain of write cycles.

Referring to FIG. 14, data is latched in every odd-numbered cycle of the address-data input controlling signal XWE and an address is latched in every even-numbered cycle thereof. It is specified that data and an address are latched in every odd-numbered cycle and every even-numbered cycle, respectively, as described above, while the address latch enable signal ALE is "H". While the address latch enable signal ALE is "L", data is latched in every cycle.

As described above, according to the present embodiment, in a case where there are a chain of write cycles, the operation of specifying from outside the access destination address and the data to be written for the next cycle is performed in parallel to the programming operation for the preceding write cycle, thereby eliminating the need for a separate address-data latch operation, which was performed serially in the prior art. Even when the programming operation is performed at a high speed, the access destination address and the data to be written can be latched from outside at a high speed. Thus, it is possible to increase the speed of the write operation.

Fifth Embodiment

A fifth embodiment of the present invention will now be described with reference to the drawings.

Figure 15:
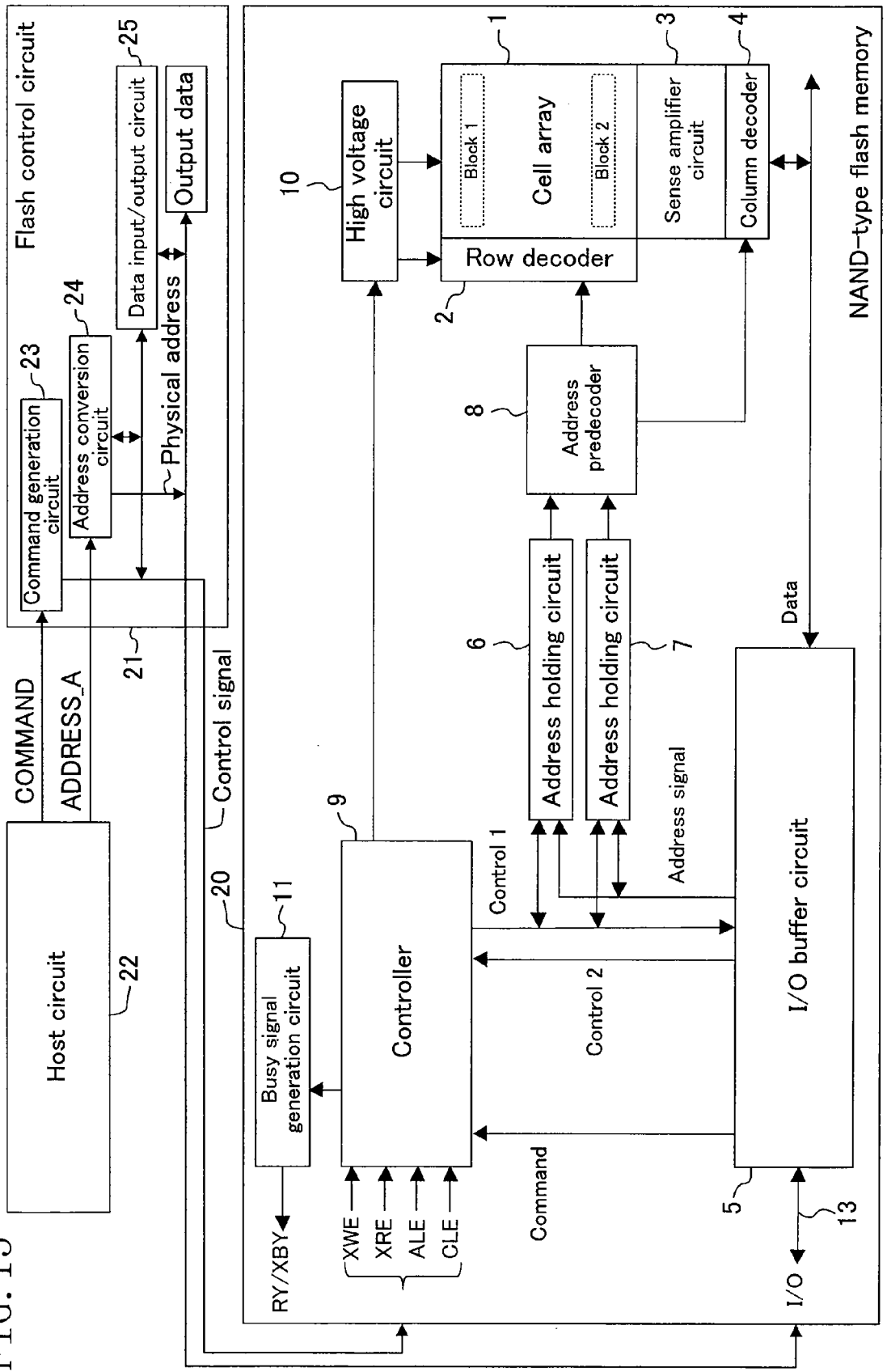
FIG. 15 is a block diagram showing a general configuration of an electronic device using a NAND-type flash memory according to a fifth embodiment of the present invention.
Figure 16:
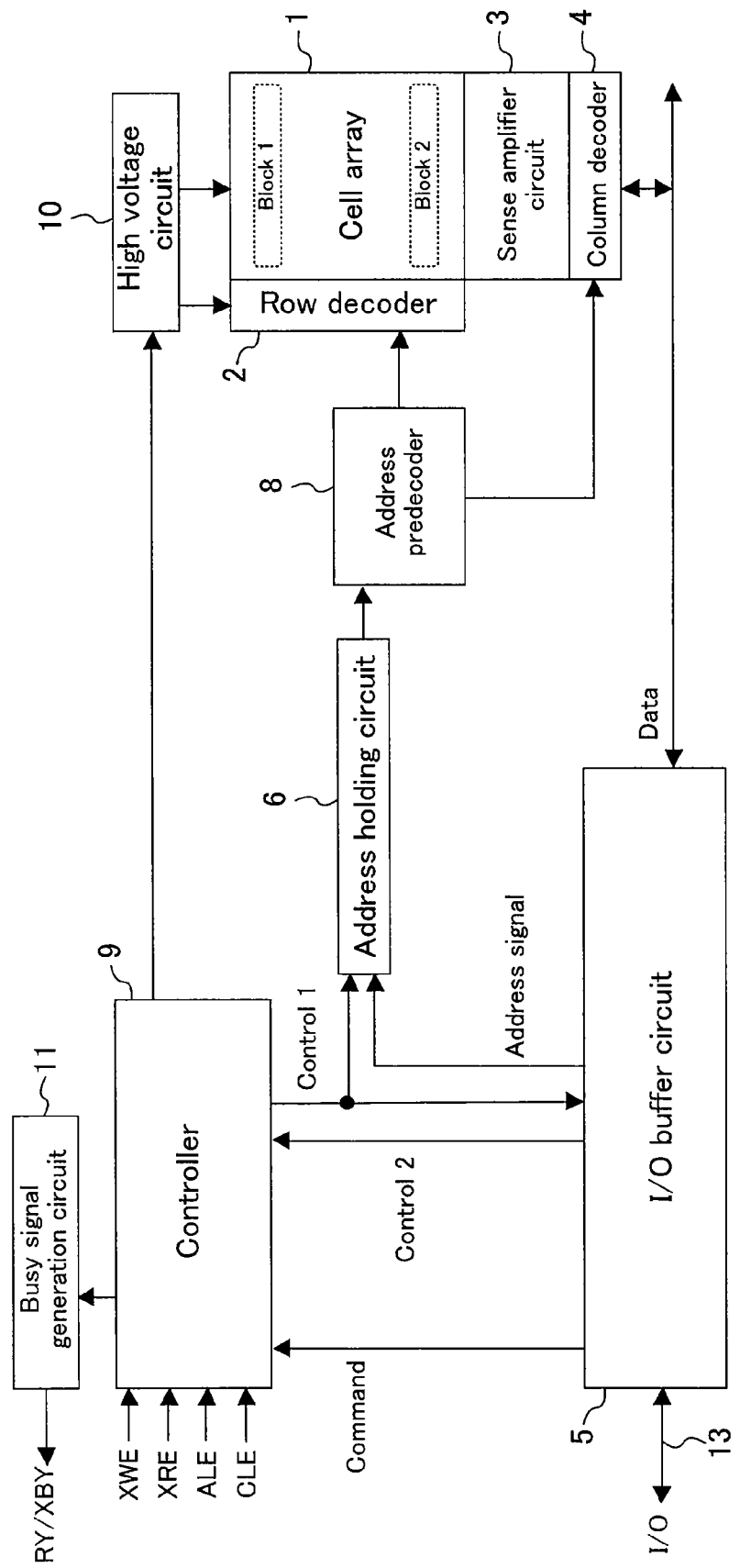
FIG. 16 is a block diagram showing a general configuration of a conventional NAND-type flash memory.
Figure 17:
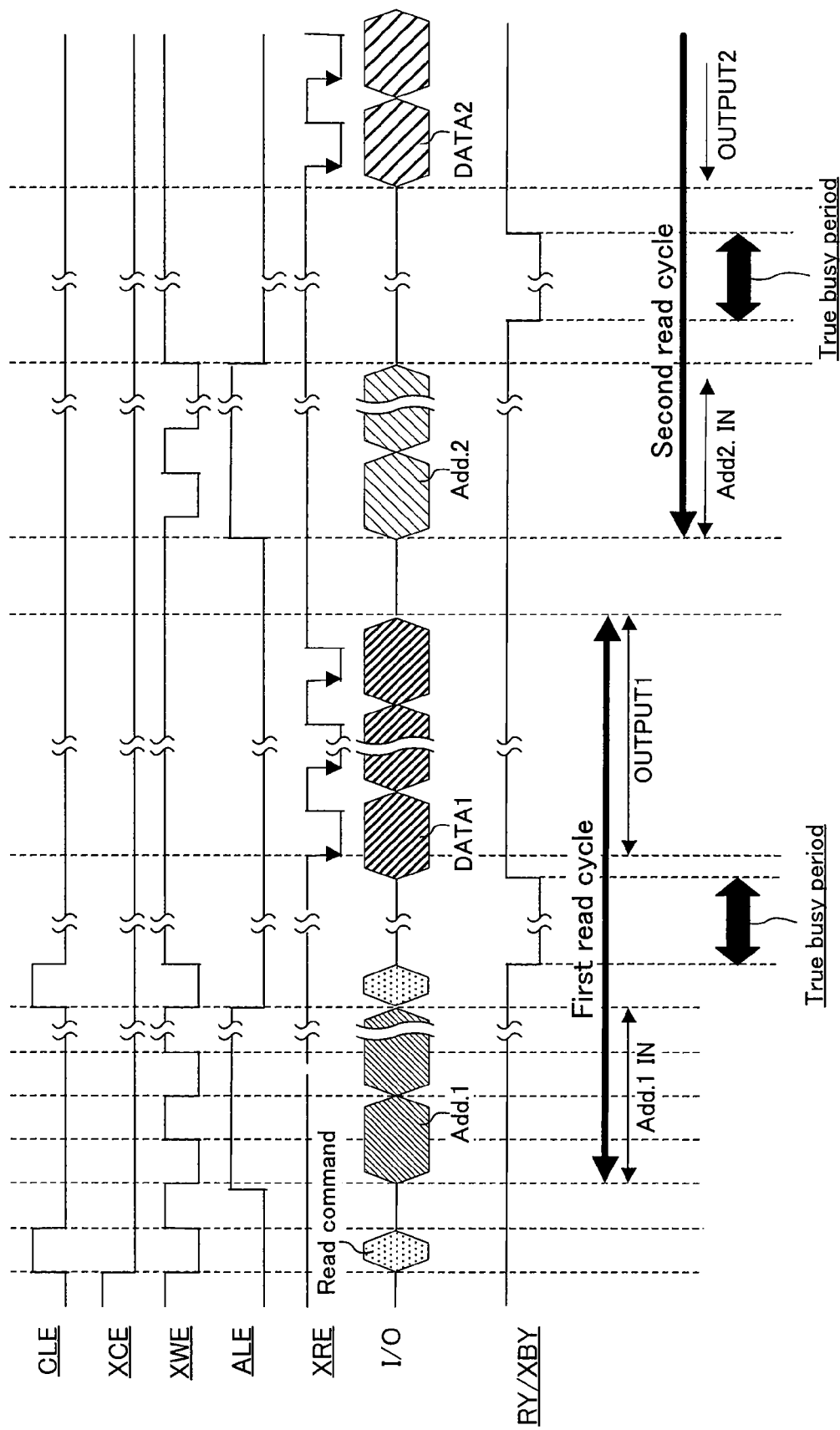
FIG. 17 is a timing chart showing a data read operation of the conventional NAND-type flash memory.
Figure 18:
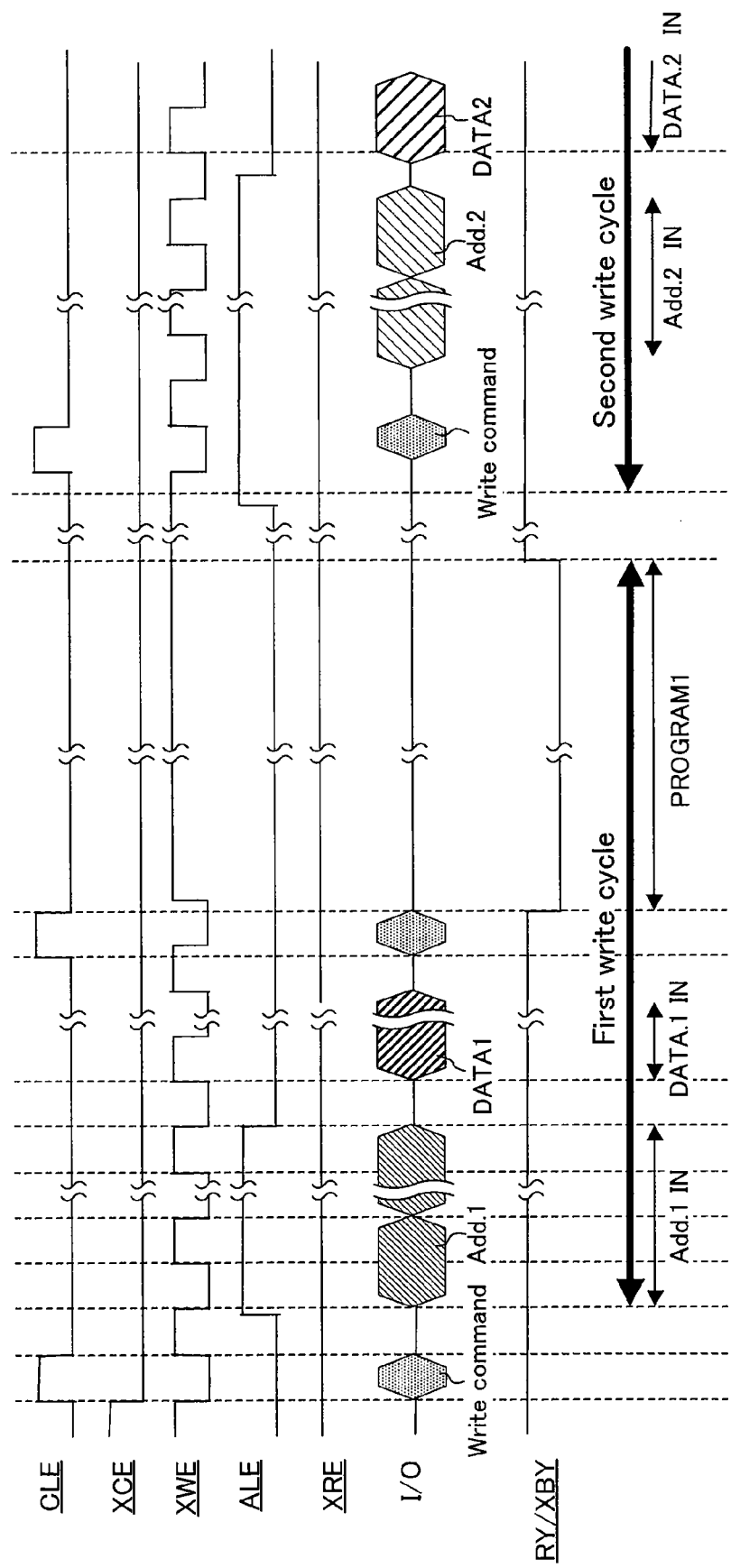
FIG. 18 is a timing chart showing a data write operation of the conventional NAND-type flash memory.
Figure 19:
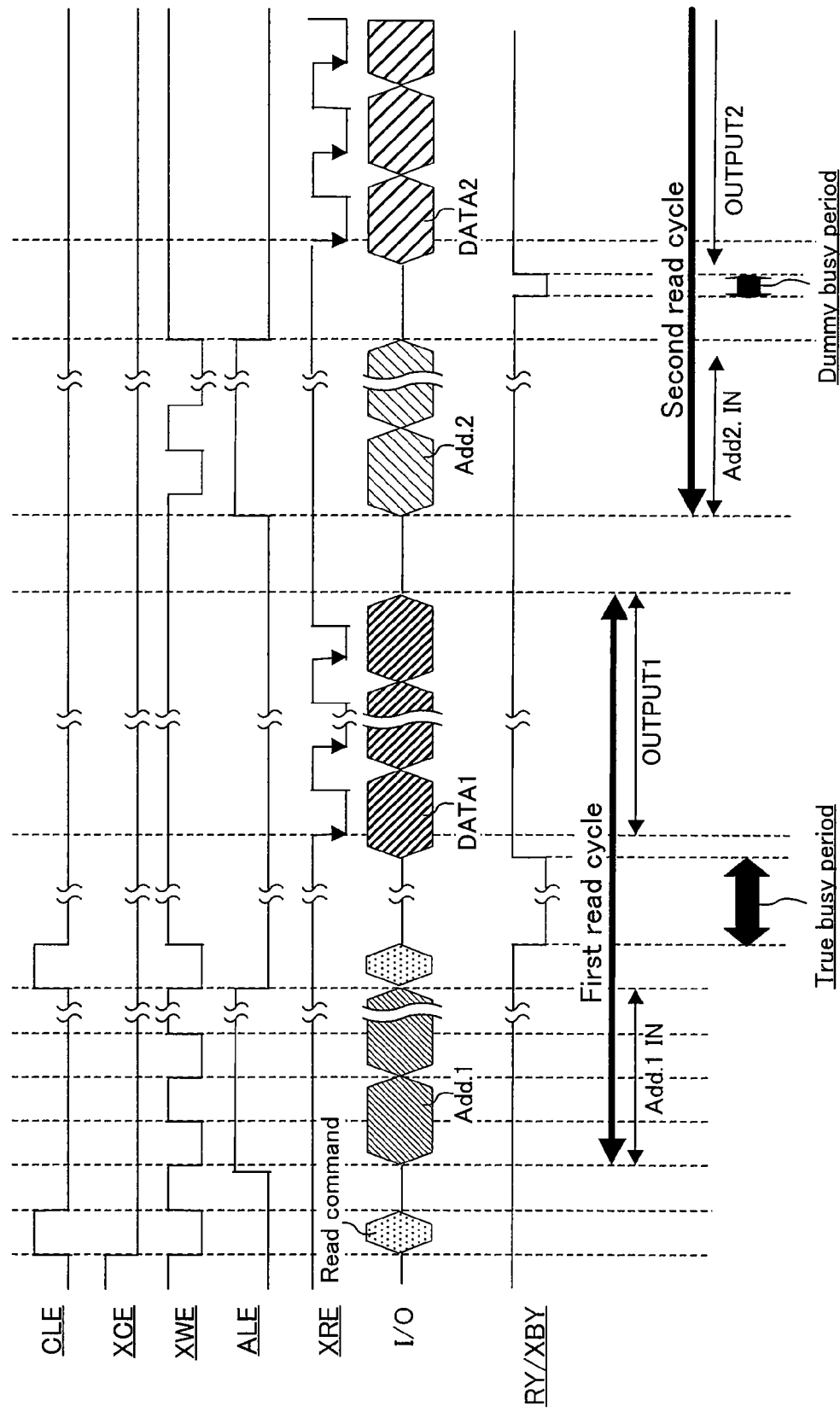
FIG. 19 is a timing chart showing a data read operation of another conventional NAND-type flash memory.

FIG. 15 is a block diagram showing a general configuration of an electronic device using a NAND-type flash memory according to a fifth embodiment of the present invention.

Referring to FIG. 15, the electronic device includes a NAND-type flash memory (hereinafter referred to as a "flash memory") 20, a flash control circuit 21 for producing control signals therefor, and a host circuit 22 for issuing operation instructions to the flash control circuit 21.

The host circuit 22 transfers a system operation command COMMAND and an access destination address ADDRESS_A to the flash control circuit 21. A command generation circuit 23 of the flash control circuit 21 converts the operation command COMMAND from the host circuit 22 to control signals (XWE, XRE, ALE, etc.) of the flash memory 20, and transfers the control signals to the flash memory 20. The flash memory 20 receives the control signals, and exchanges data with the flash control circuit 21 via the I/O line 13. A data input/output circuit 25 of the flash control circuit 21 performs data exchange operations such as latching the data output from the flash memory 20 and outputting data to be written to the flash memory 20. As to addresses, an address conversion circuit 24 of the flash control circuit 21 converts a logical address input from the host circuit 22 to a physical address representing a physical location in the flash memory 20, and transfers the physical address to the flash memory 20 via an I/O line.

With the electronic device of the present embodiment, during a read operation of the flash memory 20, the data input/output circuit 25 or the address conversion circuit 24 of the flash control circuit 21 is selectively connected to the I/O line 13 in synchronism with the read enable signal XRE, for example. For example, at a rising edge of the read enable signal XRE, the address conversion circuit 24 is connected to the I/O line 13, with the data input/output circuit 25 being disconnected, whereas at a falling edge thereof, the data input/output circuit 25 is connected to the I/O line 13, with the address conversion circuit 24 being disconnected. Thus, the operation of supplying an address to the flash memory 20 and the operation of receiving the data output from the flash memory are performed at the rising and falling edges of the read enable signal XRE.

As described above, according to the present embodiment, it is possible to realize a system including a flash memory capable of performing the read operation and the write operation at a high speed, thus realizing an electronic device capable of reading out and/or writing data at a high speed.

The above description is directed to a case where at a rising edge of the read enable signal XRE, the address conversion circuit 24 is connected to the I/O line 13, with the data input/output circuit 25 being disconnected, whereas at a falling edge thereof, the data input/output circuit 25 is connected to the I/O line 13, with the address conversion circuit 24 being disconnected. It is understood that the connection may be switched between the first cycle and the second cycle of the read enable signal XRE, e.g., based on whether the cycle is an odd-numbered cycle or an even-numbered cycle, instead of switching based on the rising/falling edges, depending on the I/F specifications of the flash memory 20 to be used.

While the above description is directed to an example where the flash memory 20 is accessed via the flash control circuit 21, it is understood that the host circuit 22 may be provided with a flash control function.

By providing a plurality of page buffer circuits in the sense amplifier circuit 3, it is possible to realize a system capable of a high-speed write operation using the flash memory 20, which is capable of a high-speed write operation, as described above in the third and fourth embodiments.

While the embodiments above have illustrated various types of operation timings, a semiconductor memory device of the present invention may be a device compatible only with one of the various types of operation timings or a device capable of switching between different modes of operation to thereby accommodate the various types of operation timings.

Different elements illustrated in different embodiments above may be combined with one another as long as such a combination is logically legitimate. For example, one or more of the read operations described above in the first and second embodiments and one or more of the write operations described above in the third and fourth embodiments may be combined together, or they may be combined with the conventional read/write operations. Moreover, the host circuit 22 and the flash control circuit 21 as described above in the fifth embodiment may be combined with one of the semiconductor memory devices of the other embodiments to obtain a semiconductor device.

As described above, according to the present invention, processing operations, which were performed serially in the prior art, are performed in parallel to each other, thus realizing a high-speed read operation and a high-speed write operation. Thus, the present invention is useful as a semiconductor memory device, a semiconductor device, etc., where it is required to read and write data at a high speed.

What is claimed is:

1. A semiconductor memory device, comprising:
  a cell array block including a plurality of memory cells arranged therein; and
  a controller, wherein the controller controls the semiconductor memory device so that:
an operation of reading out data from a second region in the cell array block is initiated before completion of an operation of outputting data read out from a first region in the cell array block;
data read out from the second region is output successively after completion of the operation of outputting data read out from the first region;
the operation of outputting data read out from the first region is performed in synchronism with a first edge of an output control signal for controlling the operation of outputting data read out from the first region; and
an address specifying the second region is latched in synchronism with a second edge of the output control signal, and
wherein the first edge is the next edge of the output control signal subsequent to the second edge.

2. The semiconductor memory device of claim 1, wherein after completion of the operation of latching the address specifying the second region, the operation of outputting data read out from the first region is performed in synchronism with the first and second edges of the output control signal.

3. The semiconductor memory device of claim 1, wherein after the completion of the operation of latching the address specifying the second region, the operation of outputting data read out from the first region continues to be performed in synchronism with the first edge of the output control signal.

4. The semiconductor memory device of claim 1, wherein the output control signal is a read enable signal.

5. The semiconductor memory device, of, claim 1 wherein:
the output control signal is a read enable signal; and
the address latching operation is controlled further by a signal for controlling an operation of latching an address and input data stored in the cell array block.

6. A semiconductor memory device, comprising:
a first address holding circuit for holding, a first address signal, which is input at a first timing;
a second address holding circuit for holding a second address signal, which is input at a second timing; and
a controller,
wherein the controller controls the semiconductor memory device so that the second address signal is input while output data is being output without changing a cycle of transferring the output data via a signal line for transferring the output data to outside,
an operation of outputting data read out from a first region in the cell array block is performed in synchronism with a first edge of an output control, signal for controlling the operation of outputting data read out from the first region,
an address specifying a second region in the cell array block is latched in synchronism with a second edge of the output control signal, and
the first edge is the next edge of the output control signal subsequent to the second edge.

7. The semiconductor memory device of claim 6, further comprising:
a first edge, detection circuit for detecting the first edge of a first signal for controlling an operation of transferring the output data to outside;
a second edge detection circuit for detecting the second edge of the first signal; and
a switching circuit for transferring the output data to outside in response to a detection signal from the first edge detection circuit and for latching the second address signal to the second address holding circuit in response to a detection signal from the second edge detection circuit.

8. The semiconductor memory device of claim 7, wherein the switching circuit compares the first address signal and the second address signal with each other.

9. A semiconductor device, comprising:
the semiconductor memory device of claim 6; and
a control circuit for outputting a control signal, a data signal and an address specifying signal to the semiconductor memory device, and for receiving a data output signal from the semiconductor memory device, wherein:
a data transfer of the address specifying signal and an input/output signal between the control circuit and the semiconductor memory device is performed via a common signal line in synchronism with the control signal;
the data output signal from the semiconductor memory device is received in synchronism with a first edge of the control signal; and
the control circuit outputs the address specifying signal in synchronism with a second edge of the control signal.

10. The semiconductor device of claim 9, further comprising a host circuit for outputting an instruction signal,
wherein the control circuit receives an instruction signal from the host circuit to output the control signal, the data signal and the address specifying signal to the semiconductor memory device, and receives the data output signal from the semiconductor memory device.

11. A semiconductor device, comprising:
the semiconductor memory device of claim 6; and
a control circuit for outputting a control signal, a data signal and an address specifying signal to the semiconductor memory device, and for receiving a data output signal from the semiconductor memory device, wherein:
a data transfer of the address specifying signal and an input/output signal between the control circuit and the semiconductor memory device is performed via a common signal line in synchronism with the control signal; and
data output signal is output to the semiconductor memory device in synchronism with first and second edges of the control signal.

12. The semiconductor device of claim 11, further comprising a host circuit for outputting an instruction signal,
wherein the control circuit receives the instruction signal from the host circuit to output the control signal, the data signal and the address specifying signal to the semiconductor memory device, and receives the data output signal from the semiconductor memory device.

13. The semiconductor memory device of claim 6, wherein the semiconductor memory device is a NAND-type flash memory.

* * * * *